(12) United States Patent
Loibl

(10) Patent No.: US 10,685,706 B2
(45) Date of Patent: Jun. 16, 2020

(54) SENSE AMPLIFIER CIRCUIT, MEMORY DEVICE, METHOD FOR DETERMINING A STATE VALUE OF A RESISTIVE MEMORY CELL AND METHOD FOR OPERATING A MEMORY DEVICE

(71) Applicant: Infineon Technologies AG, Neubiberg (DE)

(72) Inventor: Ulrich Loibl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/273,521

(22) Filed: Feb. 12, 2019

(65) Prior Publication Data

US 2019/0259451 A1 Aug. 22, 2019

(30) Foreign Application Priority Data

Feb. 20, 2018 (DE) ........................ 10 2018 103 694

(51) Int. Cl.
*G11C 11/00* (2006.01)
*G11C 13/00* (2006.01)
(Continued)

(52) U.S. Cl.
CPC .............. *G11C 13/004* (2013.01); *G11C 7/06* (2013.01); *G11C 7/062* (2013.01); *G11C 7/1006* (2013.01);
(Continued)

(58) Field of Classification Search
CPC ......... G11C 13/004; G11C 7/06; G11C 7/062; G11C 7/1006; G11C 7/1057; G11C 13/003; G11C 13/0038
See application file for complete search history.

(56) References Cited

U.S. PATENT DOCUMENTS

| 5,498,984 A | 3/1996 | Schaffer |
| 8,345,464 B2 * | 1/2013 | Kang ...................... G11C 5/02 365/148 |

(Continued)

FOREIGN PATENT DOCUMENTS

JP 2008065953 A 3/2008

*Primary Examiner* — Pho M Luu
(74) *Attorney, Agent, or Firm* — Eschweiler & Potashnik, LLC

(57) ABSTRACT

A sense amplifier circuit is provided for determining a state value of a resistive memory cell, wherein the resistive memory cell comprises a first resistive memory cell element, by means of a second resistive memory cell element, which is part of the resistive memory cell or a memory cell-external reference memory cell element. The sense amplifier circuit can include: a switch structure, a first storage element, a second storage element, and a control circuit. The control circuit controls the switch structure in such a way that in a first phase an electrical voltage present at the first resistive memory cell element or a voltage derived therefrom is fed to the first storage element and an electrical voltage present at the second resistive memory cell element or a voltage derived therefrom is fed to the second storage element. And in a second phase an electrical voltage present at the first resistive memory cell element or a voltage derived therefrom is provided and an electrical voltage present at the second resistive memory cell element or a voltage derived therefrom is provided. An evaluation circuit is configured to determine a state value of the resistive memory cell using the voltages fed to the storage elements in the first phase, or values derived therefrom, and the voltages provided in the second phase, or values derived therefrom.

21 Claims, 14 Drawing Sheets

(51) Int. Cl.
*G11C 7/10* (2006.01)
*G11C 7/06* (2006.01)
(52) U.S. Cl.
CPC ........ *G11C 7/1057* (2013.01); *G11C 13/0033* (2013.01); *G11C 13/0038* (2013.01)

(56) References Cited

U.S. PATENT DOCUMENTS

| | | | | |
|---|---|---|---|---|
| 8,400,824 B2* | 3/2013 | Rho | ............... | G11C 11/1697 |
| | | | | 365/148 |
| 8,559,243 B2* | 10/2013 | Jefremow | ............ | G11C 16/28 |
| | | | | 365/148 |
| 8,917,562 B2* | 12/2014 | Wang | ............ | G11C 13/0004 |
| | | | | 365/158 |
| 2002/0048185 A1 | 4/2002 | Thewes | | |
| 2004/0062074 A1 | 4/2004 | Ooishi | | |
| 2014/0269031 A1 | 9/2014 | Jung | | |
| 2014/0321191 A1 | 10/2014 | Bedeschi | | |
| 2016/0035432 A1 | 2/2016 | Park | | |
| 2016/0217855 A1 | 7/2016 | Bertin | | |

* cited by examiner

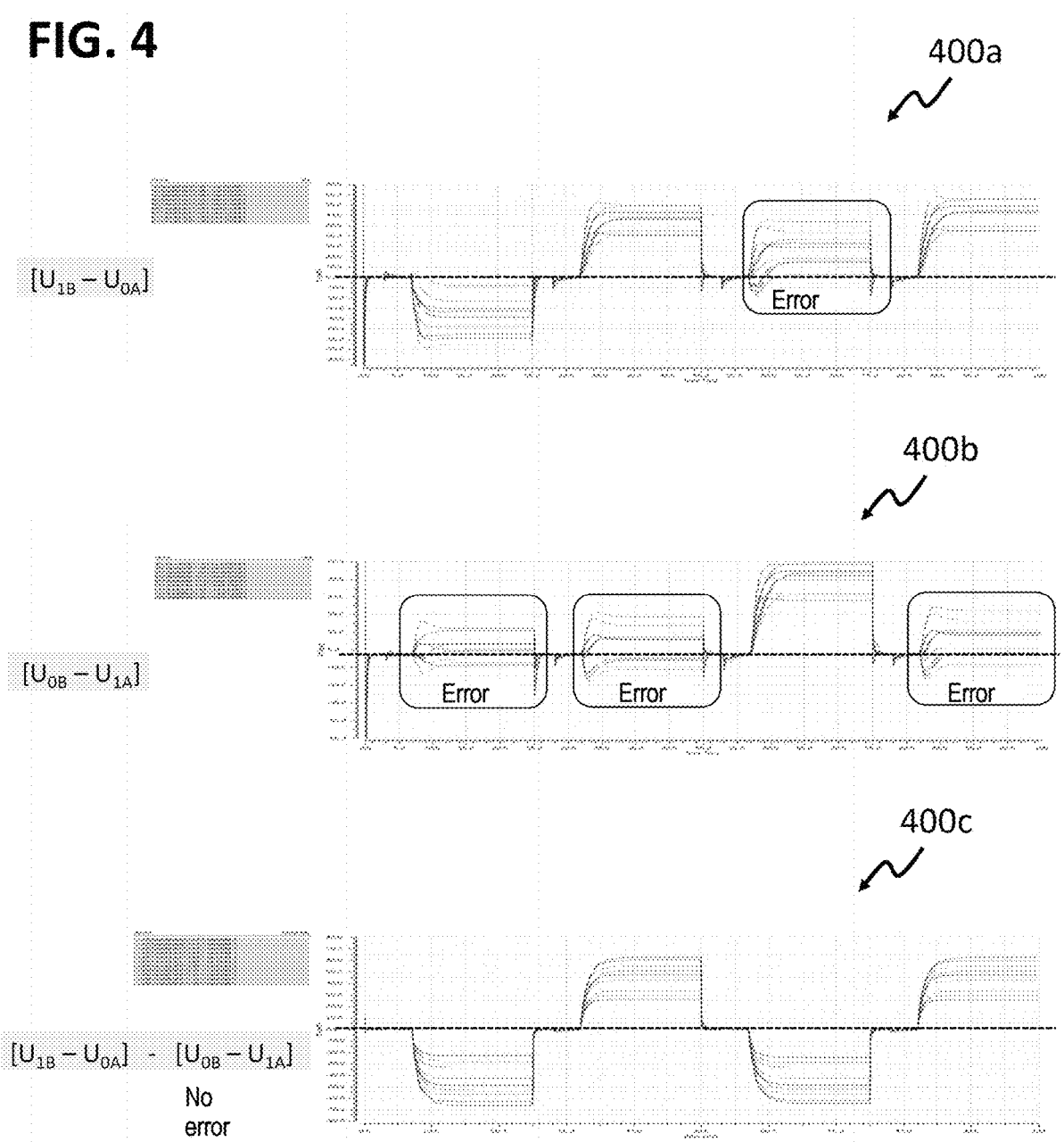

SENSE AMPLIFIER CIRCUIT, MEMORY DEVICE, METHOD FOR DETERMINING A STATE VALUE OF A RESISTIVE MEMORY CELL AND METHOD FOR OPERATING A MEMORY DEVICE

REFERENCE TO RELATED APPLICATIONS

This application claims priority to DE 10 2018 103 694.9 filed on Feb. 20, 2018, the contents of which are incorporated by reference in their entirety.

FIELD

The disclosure relates generally to a sense amplifier circuit, a memory device, a method for determining a state value of a resistive memory cell, and a method for operating a memory device.

BACKGROUND

In order to read out a stored value, e.g. a bit value, in an electronic memory, usually either a reference signal is used, which lies between the two states representing the '0' and the '1', or a complementary bit is used. When the complementary bit is used, two memory cells or memory cell elements are brought to mutually complementary states. The state '0' can then be represented for example by the combination '0', '1', and the state '1' by the opposite combination '1', '0'. During read-out, the two states then need only be compared with one another; a reference signal can be dispensed with.

FIG. 1A to FIG. 1D illustrate the states as frequency distributions of a respective state value (current I in FIG. 1A, FIG. 1C, FIG. 1D and resistance R in FIG. 1B; generally it is possible to use e.g. Vt, R, I, t for the state value) which are encountered in memory cells that have been programmed into the two respective memory states (designated here by 1 and 0, respectively). The frequency distributions usually exhibit a broad distribution. The fact that the two distributions do not overlap, but rather are separated from one another by a gap (designated as read window), makes it possible, on the basis of the state value—either in relation to a reference value ($I_{ref}$ in FIG. 1C) arranged in the read window or in the comparison of two complementary state values with one another—, to unambiguously assign a memory value to a read cell. This is accomplished all the more reliably and rapidly, the larger the read window.

The read window can be characterized by a factor k=(b−a)/a, which is also designated as relative read window. In this case, a is the highest value that is expected or encountered for the distribution lying closer to zero, and b is the lowest value that is expected or encountered for the distribution lying further away from zero.

Hitherto, as is illustrated in FIG. 1C, factors of more than 6 have been customary.

In recently developed memory devices (e.g. MRAM) the read window and thus the gap between the complementary bits or between the bit and the reference bit is extremely small. This is illustrated in FIG. 1D for an exemplary MRAM memory for which the factor k=0.05.

At the same time, however, access times for reading out a bit are also intended to be reduced further and further.

Hitherto no sense amplifier has been able to read out within an acceptable time (e.g. <20 ns) given such a small read window.

BRIEF DESCRIPTION OF THE DRAWINGS

In the drawings, similar reference signs usually refer to the same parts in all the different views, wherein providing all mutually corresponding parts with reference signs in all figures is dispensed with in some instances for the sake of clarity. Parts of the same or a similar type, in addition to a common reference sign, can be provided with an added number or an added letter for differentiation. The drawings are not necessarily intended to constitute a representation true to scale; rather, the emphasis is on illustrating the principles of the invention. In the following description, various embodiments of the invention are described with reference to the following drawings, in which:

FIG. 4 shows a comparison of Monte Carlo simulations for read-out processes using the read circuit from FIG. 2B and the read circuit from FIG. 3A;

DETAILED DESCRIPTION

Figure 1A:
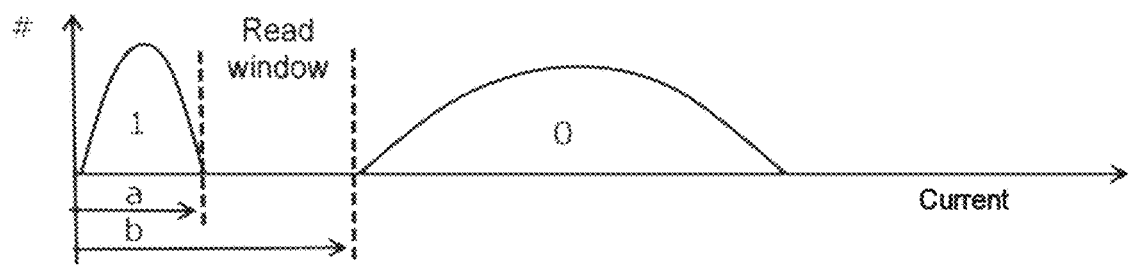
FIG. 1A to FIG. 1D show memory cell states as frequency distributions of a respective state value.
Figure 1B:
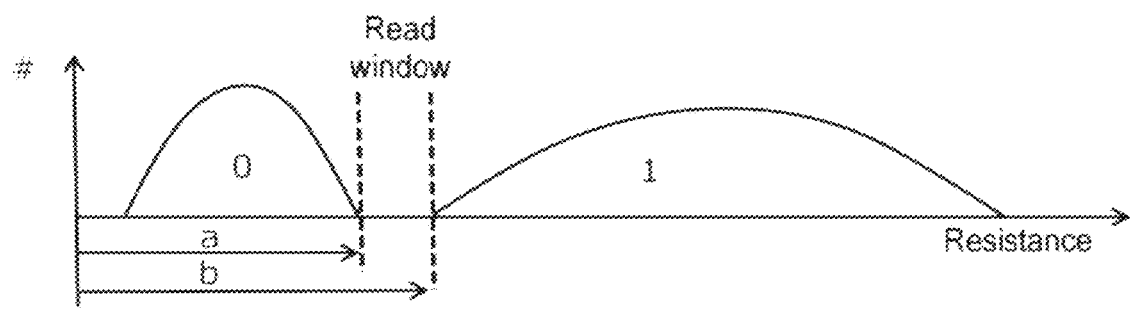
Figure 1C:
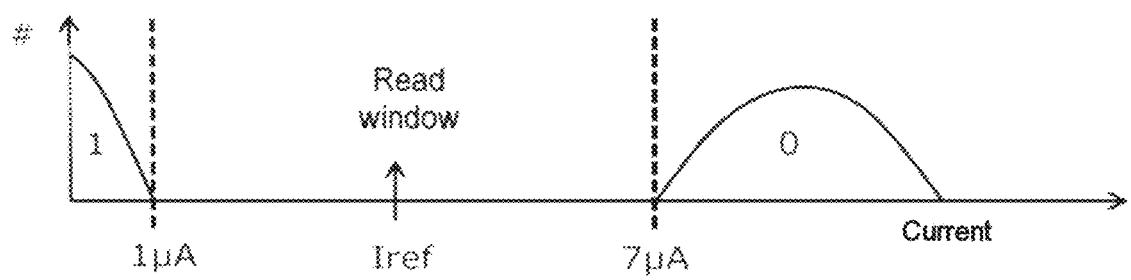
Figure 1D:
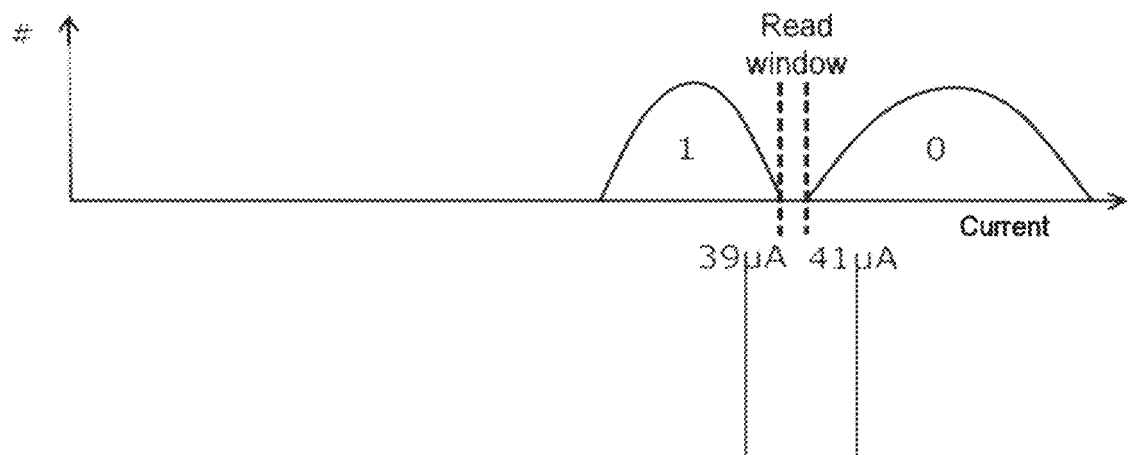

The following detailed description refers to the accompanying drawings, which show as an example by illustration specific details and embodiments in which the invention can be implemented in practice.

The word "exemplary" is used herein with the meaning of "serving as an example, an exemplar or an illustration". All embodiments or configurations described as "exemplary"

herein should not necessarily be interpreted as preferred or advantageous vis à vis other embodiments or configurations.

A new measurement or detection concept for state values of memory cells is provided, which offers a higher speed and an improved accuracy in comparison with all known possibilities.

A fast and accurately operating sense amplifier for reading from memories is advantageous for recent memory devices such as, for example, MRAM, RRAM, PCRAM or CBRAM.

In various exemplary embodiments, a sense amplifier circuit is provided which satisfies requirements with regard to a read window and an access time.

If time stipulations are less demanding, an accuracy of the sense amplifier can even be increased still further. Hitherto no more suitable solution has existed for accurately reading from the abovementioned types of memory devices with a small read window at high speed.

In the case of the proposed sense amplifier, the known limitations with regard to speed and accuracy are overcome by combining, in one embodiment, (up to) eight aspects within a single circuit. These aspects are:
1) Avoiding unequal measurement paths
2) Improving the signal-to-noise ratio
3) Optimizing the operating point
4) Minimizing the number of devices used
5) Offset compensation
6) Crosstalk minimization
7) Reducing voltage supply influences and
8) Noise reduction It is postulated that absolute values are irrelevant here, rather only relationships matter.

In various exemplary embodiments, the sense amplifier circuit can be fashioned, and the associated method for determining a state value of a resistive memory cell can be embodied, such that not all eight aspects are realized, but rather, insofar as technically independently realizable, for example only one or a plurality of aspects. However, every further added aspect additionally improves at least an accuracy when determining the state value of the resistive memory cell. An optimum result can be achieved when all eight aspects are realized.

The eight aspects/principles and measures proposed for implementing them are summarized in the manner of salient points in the following table:

| Incorporated principle | Measure |
| --- | --- |
| Avoiding unequal measurement paths | Serial measurement via the same path |
| Improving the signal-to-noise ratio | Double measurement |
| Optimizing the operating point | Self-adjustment of voltages |
| Minimizing the number of devices used | Reducing the number of devices used |
| Offset compensation | Adding adaptation currents |
| Crosstalk minimization | Crosstalk minimization |
| Reducing voltage supply influences | GND reference of all internal levels |
| Suppressing interference influences | No external reference |

Figure 2A:
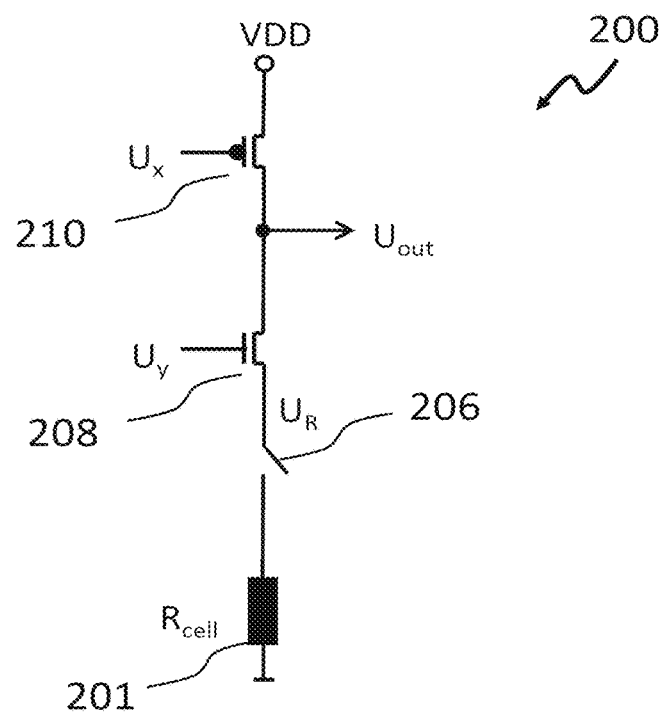
FIG. 2A shows a read circuit for reading out a state value of a memory cell in accordance with the prior art.
Figure 2B:
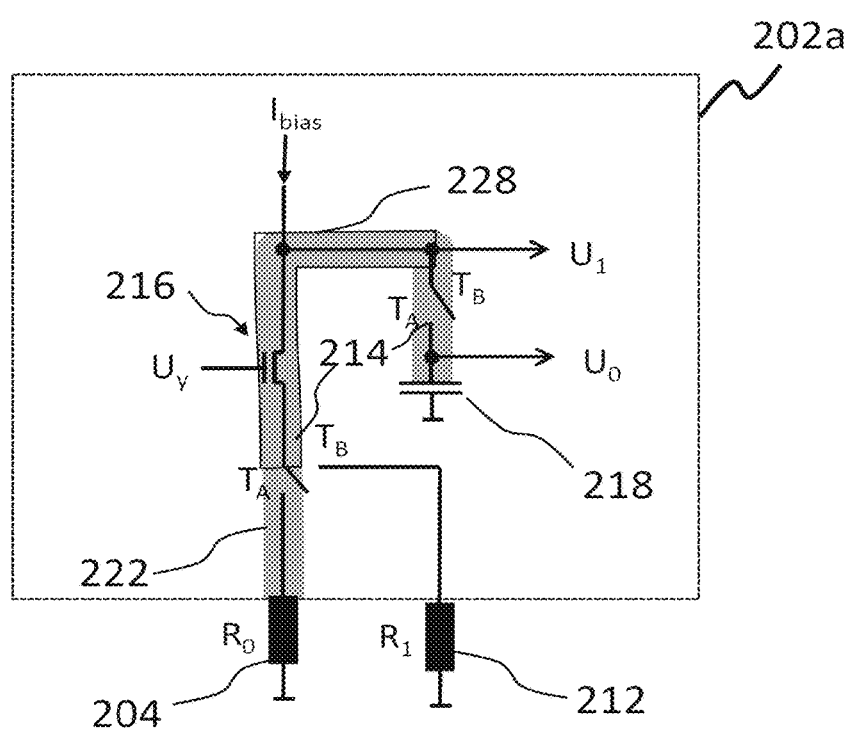
FIG. 2B shows a read circuit for reading out a state value of a memory cell in accordance with various exemplary embodiments.
Figure 3A:
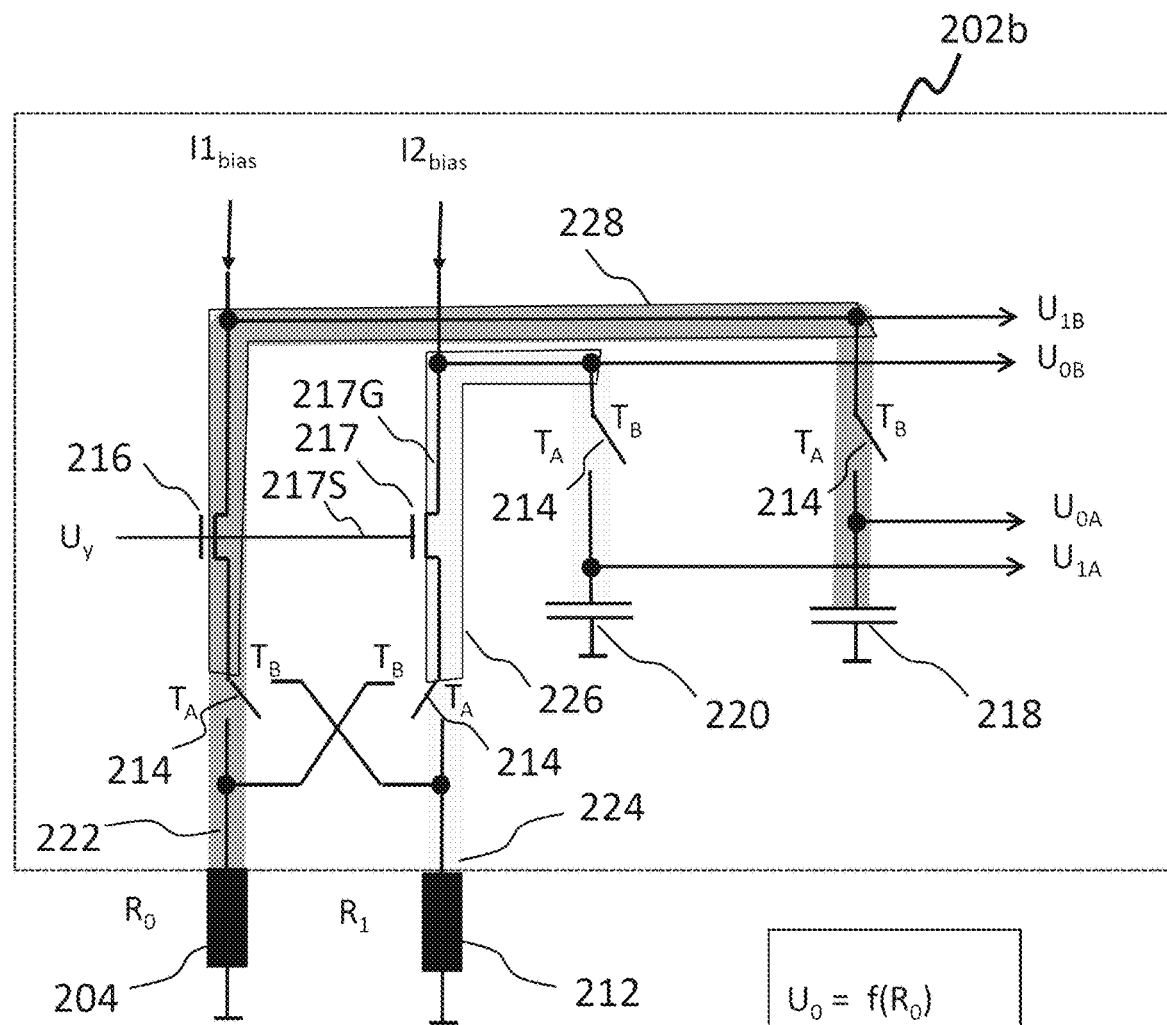
FIG. 3A shows a read circuit for reading out a state value of a memory cell in accordance with various exemplary embodiments.
Figure 3B:
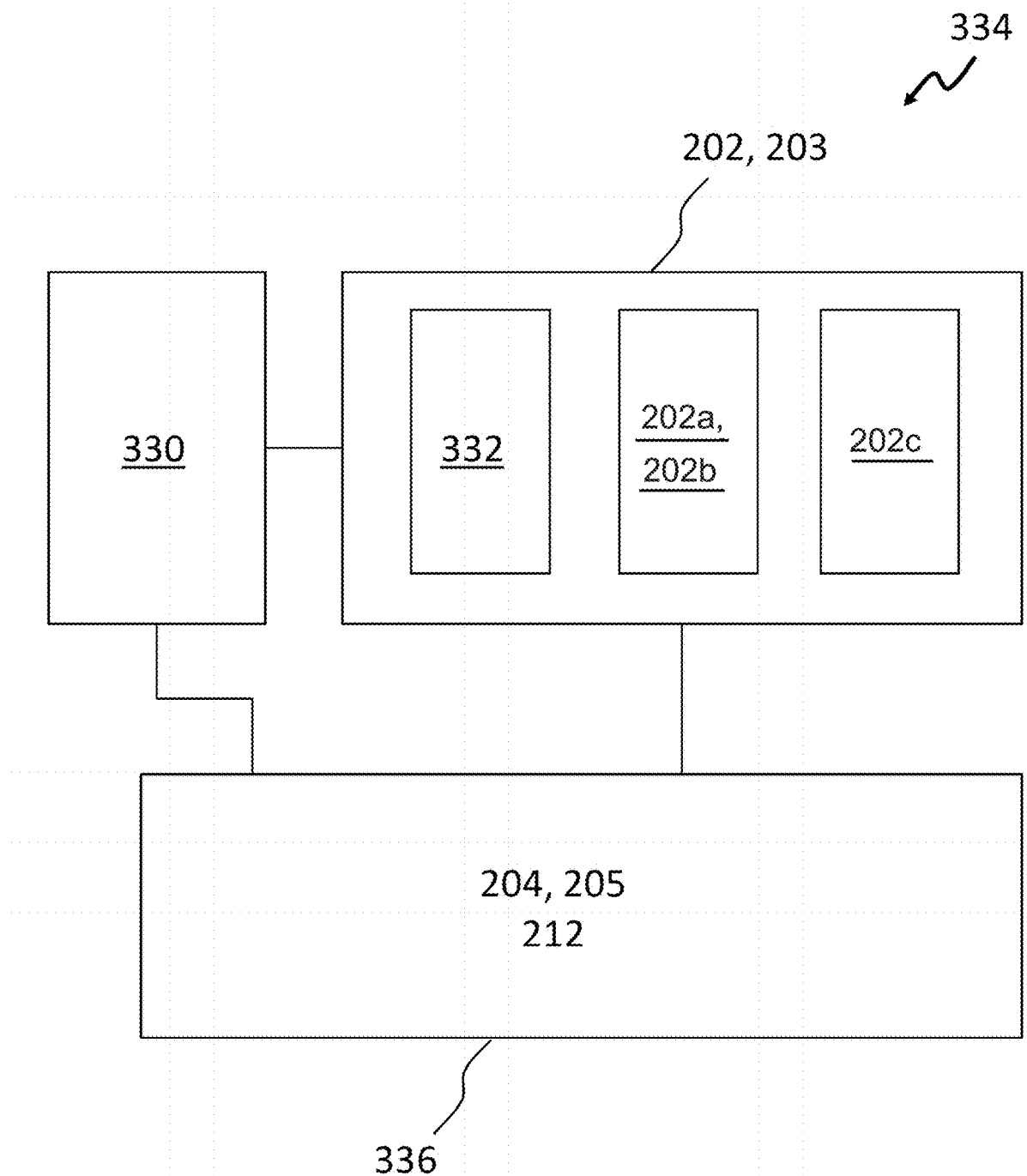
FIG. 3B shows a memory device in accordance with various exemplary embodiments.
Figure 5:
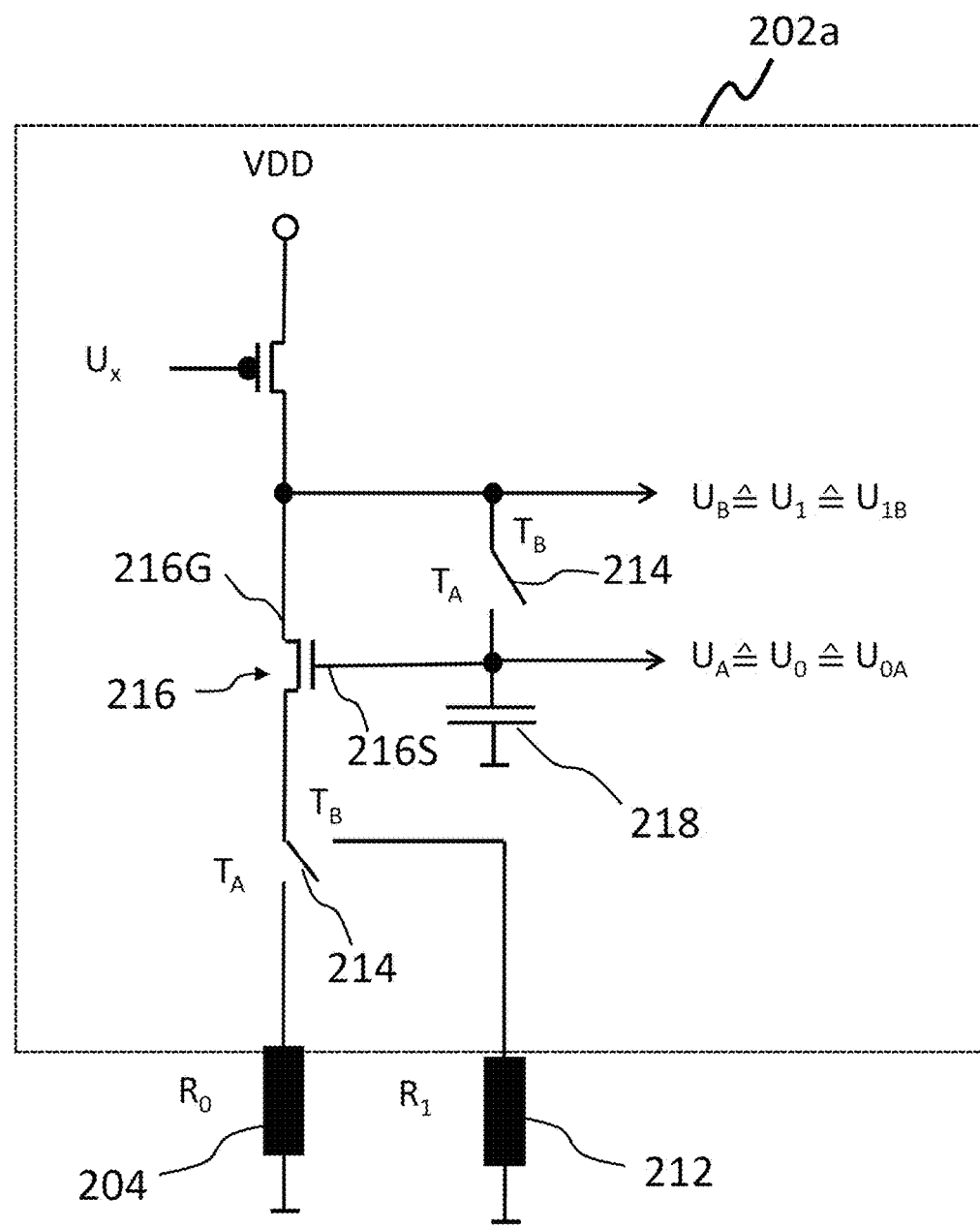
FIG. 5 shows a read circuit for reading out a state value of a memory cell in accordance with various exemplary embodiments.
Figure 10:
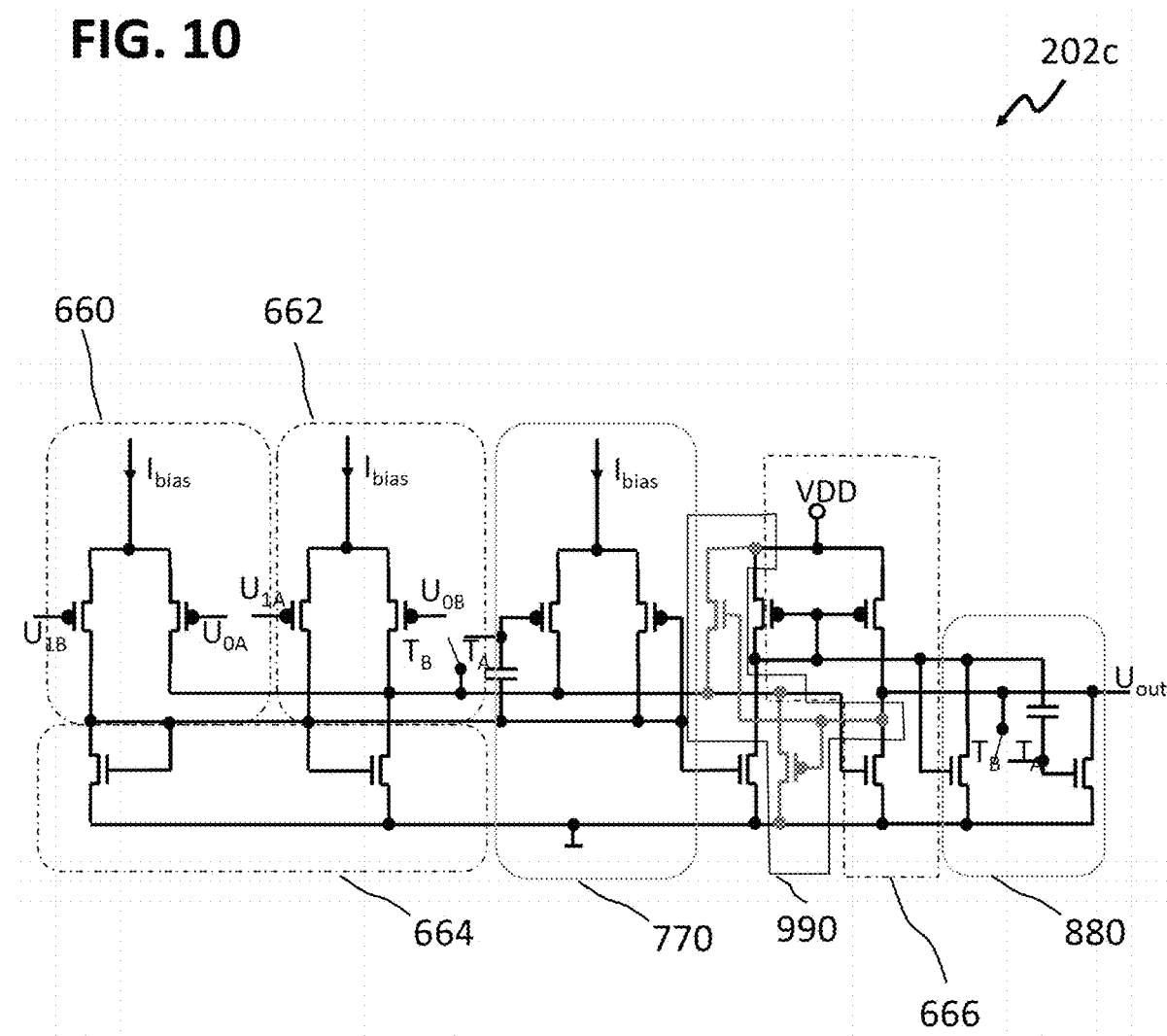
FIG. 10 shows an evaluation circuit for evaluating a state value of a memory cell in accordance with various exemplary embodiments.
Figure 11:
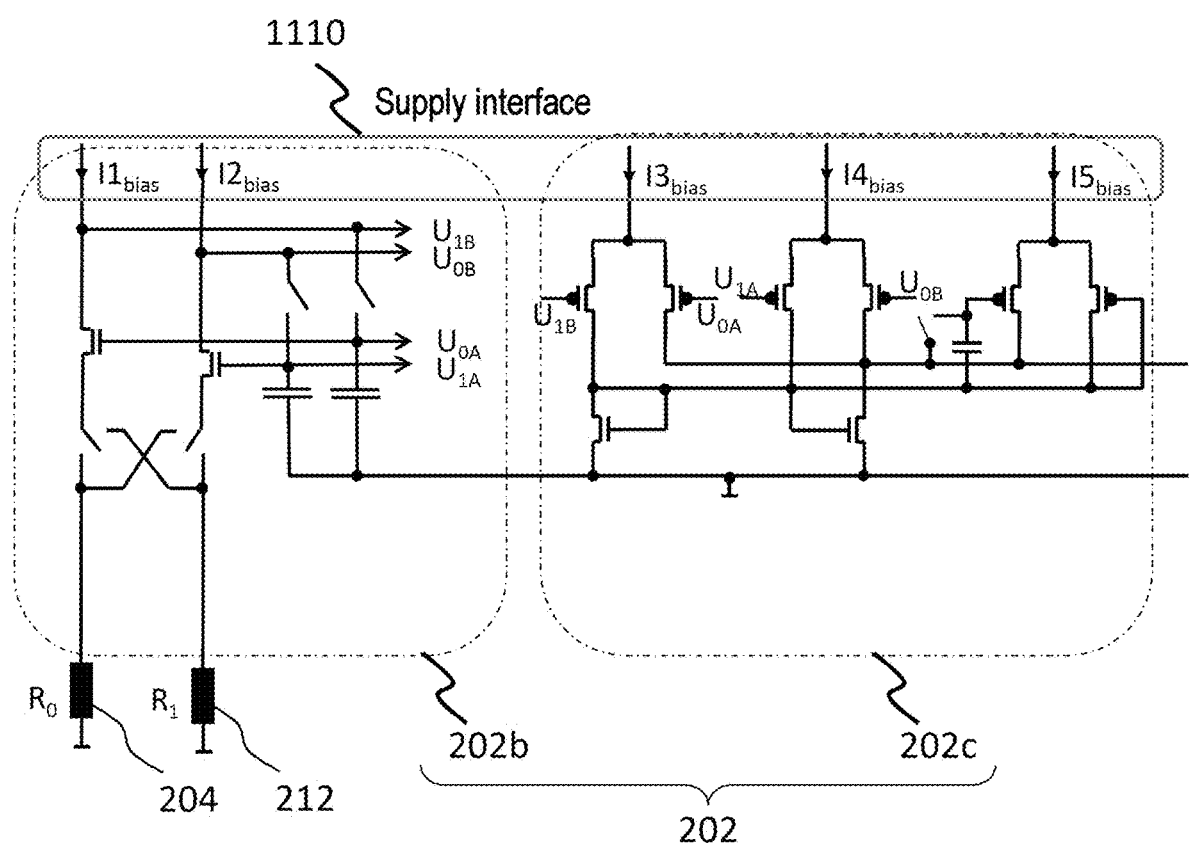
FIG. 11 shows a sense amplifier circuit for determining a state value of a memory cell in accordance with various exemplary embodiments.
Figure 12:
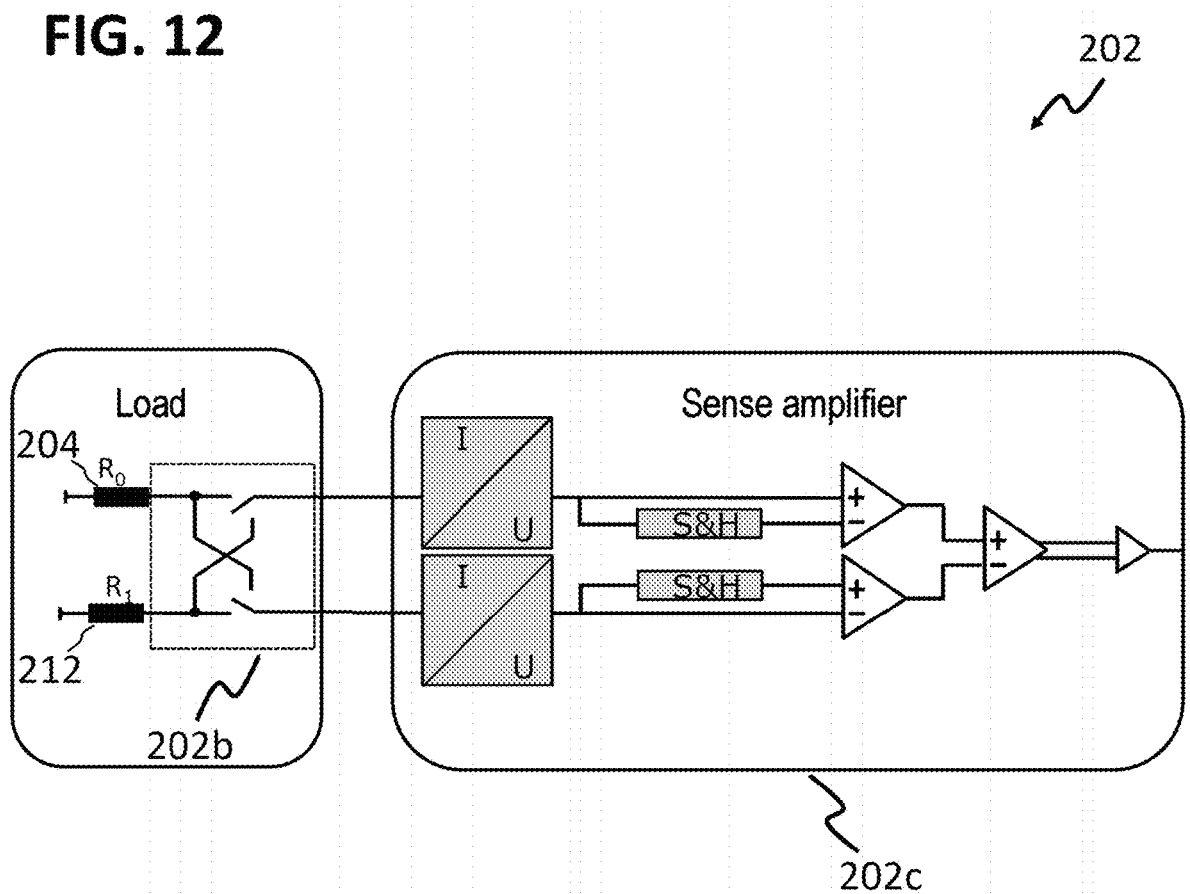
FIG. 12 shows a block diagram of a sense amplifier circuit for determining a state value of a memory cell in accordance with various exemplary embodiments.

The individual aspects are explained in greater detail below with reference to the figures, wherein FIG. 3B illustrates a memory device 334 in accordance with various exemplary embodiments, FIG. 11 and FIG. 12 illustrate sense amplifier circuits 202 in accordance with various exemplary embodiments which can be part of the memory device 334, FIG. 2B, FIG. 3A and FIG. 5 illustrate read circuits 202a and 202b, respectively, which can be part of the sense amplifier circuit 202, and FIG. 7A, FIG. 7B, FIG. 8, FIG. 9 and FIG. 10 in each case illustrate an evaluation circuit 202c, which can be part of the sense amplifier circuit 202.

1) Avoiding Unequal Measurement Paths

FIG. 2A shows one of the simplest read circuits 200 for reading out a state value (here by way of example the resistance $R_{cell}$i) of a memory cell 201, which in accordance with the prior art are currently used to provide an output signal $U_{out}$ as input signal of an evaluation circuit.

The read circuit 200 comprises two independent transistors 208, 210 and a switch 206. A bias current is defined by a control voltage $U_x$ at the transistor 210, and a measurement voltage is provided as $U_y$ at the control terminal of the transistor 208. The output signal $U_{out}$ is a function of the cell resistance $R_{cell}$, wherein the transistor 208 acts as an amplifier that amplifies changes in the voltage $U_R$ dropped for instance at the point marked by $U_R$, said voltage likewise being dependent on the cell resistance $R_{cell}$, with the result that $U_{out}$ has a higher sensitivity than $U_R$.

With use of the read circuit 200 (or a similar circuit), a dedicated circuit would be used for reading from a reference cell or a complementary memory cell in accordance with the prior art. That can have the effect that a measurement error is introduced into the measurement signal owing to different properties of the two circuits (in particular when passing through different transistors).

In various exemplary embodiments, in the case of a sense amplifier circuit 202 (for an exemplary embodiment in which all eight aspects are taken into account, see FIG. 10, FIG. 11 or FIG. 12), a read circuit 202a can be provided such as is illustrated by way of example in FIG. 2B.

In this case, the measuring device, i.e. the read circuit 202a, for determining a difference between a state value of a memory cell element 204 (referred to hereinafter as first resistive memory cell element 204) and a complementary memory cell element or an external reference memory cell element 212 (referred to hereinafter as second resistive memory cell element 212) is always the same. When providing a measurement value $U_0$ with respect to the first memory cell element 204, it is possible to use the same section 228 of the read circuit 202a as when providing a measurement value $U_1$ with respect to the second memory cell element 212. The section 228 common to both measuring processes can comprise a first transistor 216. The read circuit 202a can be fashioned such that no transistors which do not lie in the common section 228 are arranged between the respective memory cell element 204, 212 and an associated output at which an assigned output signal ($U_0$ and $U_1$, respectively) is provided.

In order to enable a common section 228 to be used, the two measuring processes can be carried out successively. For illustration purposes, hereinafter the designation $T_A$ is used for a first time segment, in which the first measuring process is carried out, and the designation $T_B$ is used for a second time segment, in which the second measuring process is carried out.

In order to make it possible to simultaneously provide both measurement results $U_0$ and $U_1$ to an evaluation circuit 202c, which can comprise one or a plurality of comparators and can therefore also be designated as comparator circuit 202c, the first measurement result $U_0$ can be buffer-stored during $T_A$. During $T_B$, the measurement result $U_1$ is determined, and the stored measurement result $U_0$ is provided together with $U_1$.

The read circuit 202a (and likewise the read circuit 202b described below) can comprise a switch structure 214 and a control circuit 332 (see FIG. 3B). The control circuit 332 can be configured to control the switch structure 214 (for example the two switches illustrated schematically in FIG. 2B) in such a way (to the position $T_A$) that in the first phase $T_A$ an electrical voltage present at the first resistive memory cell element 204 or an (e.g. amplified) voltage $U_0$ derived therefrom is fed to a first storage element 218. The corresponding path, which forms a first part 222 of the read circuit 202a, is indicated with a gray background in FIG. 2B. The control circuit 332 can furthermore be configured to control the switch structure 214 (for example the two switches illustrated schematically in FIG. 2B) in such a way (to the position $T_B$) that in the second phase $T_B$ an electrical voltage present at the second resistive memory cell element 212 or an (e.g. amplified) voltage $U_1$ derived therefrom is provided. For the sake of clarity, only that section 228 of the corresponding path is indicated which is common to the first part 222 and to the path. This section 228 is indicated as a frame in FIG. 2B. The first transistor 216 (the sole transistor of this exemplary read circuit 202a) can be part of the section 228.

$U_1-U_0$ here is (only) a measure of a difference between the resistances $R_1$ and $R_0$, i.e. of $R_1-R_0$.

In the case of a measurement using the read circuit 202a, the result is valid only if $I_{bias}$ and $U_y$ are constant during an access time $T_{access}$, which is a sum of $T_A$ and $T_B$ (that is to say $T_{access}=T_A+T_B$).

An absolute constancy of $I_{bias}$ and $U_y$ during the access time $T_{access}$ typically cannot be ensured or fluctuations may even be customary, for example in the case of a circuit that has not yet settled after a switch-on of the device. Random fluctuations of $I_{bias}$ and $U_y$ during the access time $T_{access}$ can become apparent as noise in the measurement results $U_0$ and $U_1$. The second aspect explained below serves for improving the signal-to-noise ratio.

2) Improving the Signal-to-Noise Ratio

In various exemplary embodiments, a double measurement is carried out in order to improve the signal-to-noise ratio. In this case, each measuring process (which is taken to mean determining the measurement results $U_0$ and $U_1$, respectively) is carried out twice. That is to say that there is in each case a measurement result $U_0$ and respectively $U_1$ from the first phase (designated as $U_0(T_A)$ and respectively $U_1(T_A)$) and in each case a measurement result $U_0$ and respectively $U_1$ from the second phase (designated as $U_0(T_B)$ and respectively $U_1(T_B)$). In this case, the first and second measurements are carried out by means of two independent (or more correctly: interchanged) measurement paths. Thus, disturbances can be eliminated and a sensitivity can be doubled.

In this case, the measurement results are evaluated (subtracted from one another) as follows, wherein the evaluation can be carried out for example in the evaluation circuit 202c explained in greater detail in association with FIG. 6 to FIG. 12:

$$[U_1(T_B)-U_0(T_A)]-[U_0(T_B)-U_1(T_A)]=2[U_1-U_0]$$

Hereinafter, in a shortening manner, the notation $U_{0A}$ is also used for $U_0(T_A)$ etc.

The fact that disturbances that are similar to one another can be eliminated in this measuring method can be illustrated as follows (in this case, $U_S$ represents the disturbance, e.g. caused by a bias change):

$$[U_1(T_B)-U_0(T_A)+U_S]-[U_0(T_B)-U_1(T_A)+U_S]=2[U_1-U_0]$$

As is evident, the disturbance $U_S$, which concerns only one of the two points in time ($T_A$ or $T_B$), but both measurements carried out at this point in time, mutually cancels out.

The measurement path is thus doubled in order to achieve a higher sensitivity and in order to eliminate an influence of measurement conditions which are changed during $T_B$ vis à vis $T_A$ and which have a comparable effect on both paths. In one exemplary embodiment of a read circuit 202b, such as is illustrated in FIG. 3A, only a combination of the two differences can be detected.

One exemplary embodiment for realizing the double measurement is illustrated in FIG. 3A. In the case of the read circuit 202b in accordance with FIG. 3A, the control circuit 332 (see FIG. 3B) can be configured to control the switch structure 214 (for example the four switches illustrated schematically in FIG. 3A) in such a way (to the position "$T_A$") that in the first phase $T_A$ an electrical voltage $U_{0A}$ present at the first resistive memory cell element 204 or one derived therefrom is fed to a first storage element 218 (the corresponding path, which forms a first part 222 of the read circuit 202b, is indicated with a dark gray background in FIG. 3A) and an electrical voltage $U_{1A}$ present at the second resistive memory cell element 212 or one derived therefrom is fed to a second storage element 220 (a corresponding path, which forms a second part 224 of the read circuit 202b, is indicated with a light gray background in FIG. 3A). The control circuit 332 can furthermore be configured to control the switch structure 214 (for example the four switches illustrated schematically in FIG. 3A) in such a way (to the position "$T_B$") that in the second phase $T_B$ an electrical voltage $U_{0B}$ present at the first resistive memory cell element 204 or one derived therefrom is provided and an electrical voltage $U_{1B}$ present at the second resistive memory cell element 212 or one derived therefrom is provided.

In the second phase $T_B$, the voltage $U_{0A}$ stored in the first storage element 218 in the first phase and the voltage $U_{1A}$ stored in the second storage element 220 can furthermore be provided.

The first and second storage elements 218, 220 can comprise or be capacitors, for example.

In this case, as described above in association with the read circuit 202a, for the purpose of providing the electrical voltage present at the second resistive memory cell element 212 or the electrical voltage derived therefrom in the second phase $T_B$, it is possible to use a path of which in FIG. 3A, for the sake of clarity, only that section 228 is indicated which is common to the first part 222 and to the path. Said section 228 of the first part 222 is indicated as a frame in FIG. 3A. The first transistor 216 can be part of the section 228.

In a comparable manner, for the purpose of providing the electrical voltage present at the first resistive memory cell element 204 or the electrical voltage derived therefrom in the second phase $T_B$, it is possible to use a further path, of which in FIG. 3A, for the sake of clarity, only that section 226 is indicated which is common to the second part 224 and to the further path. Said section 226 is indicated as a frame in FIG. 3A. The section 226 can comprise a second transistor 217.

As is illustrated in FIG. 3B, the read circuit 202a or the read circuit 202b can be part of the memory device 334, for example of an MRAM, RRAM, PCRAM or CBRAM memory device.

In the memory device 334, the read circuit 202a or 202b can be part of the sense amplifier circuit 202. The sense amplifier circuit 202 can furthermore comprise the evaluation circuit 202c, and also a control circuit 332. In various exemplary embodiments, the memory device 334 can comprise one or a plurality of further sense amplifier circuits 203 in addition to the sense amplifier circuit 202. The memory device 334 can furthermore comprise a data memory 336 comprising at least the memory cell comprising the first memory cell element 204 and the second memory cell element 212. Furthermore, the data memory 336 can comprise at least one further memory cell element 205. The memory device 334 can furthermore comprise a driver 330, e.g. a drive circuit 330, which can be configured to generally drive the data memory 336 and the sense amplifier circuit 202 and/or 203, for example by means of addressing the data memory 336 and addressing the corresponding sense amplifier circuit 202 and/or 203, and if appropriate for further customary drive processes.

FIG. 4 shows a comparison of Monte Carlo simulations for read-out processes using the read circuit from FIG. 2B (in 400a and 400b) and the read circuit from FIG. 3A (in 400c). This involved simulating an occurrence of disturbance signals which can lead to an erroneous evaluation with the use of only respectively one voltage value per memory cell element ($U_{1B}$–$U_{0A}$ in the case of view 400a and $U_{0B}$–$U_{1A}$ in the case of view 400b). In contrast thereto, the use of all four voltage values provided when using a read circuit 202b shown in FIG. 3A in accordance with [$U_{1B}$–$U_{0A}$]–[$U_{0B}$–$U_{1A}$] can enable the state value of the memory cell to be determined without errors.

3) Optimizing the Operating Point

A maximum measurement sensitivity with regard to the voltage $U_B$ provided can be achieved if the read circuit 202a or respectively 202b is of self-adjusting design. That is illustrated in FIG. 5, which shows a self-adjusting read circuit 202a for reading out a state value of a memory cell 204 in accordance with various exemplary embodiments.

The read circuit 202a from FIG. 5 is illustrated as a modification of the read circuit 202a from FIG. 2B. It is likewise possible to realize the aspect of optimizing the operating point in the case of the read circuit 202b from FIG. 3A. That is illustrated by way of example in FIG. 11. Accordingly, the output voltage $U_A$ from FIG. 5 corresponds to the voltage $U_0$ from FIG. 2B and the voltage $U_{0A}$ from FIG. 11, and the output voltage $U_B$ from FIG. 5 corresponds to the voltage $U_1$ from FIG. 2B and the voltage $U_{1B}$ from FIG. 11.

The transistors in the read circuit 202a or respectively 202b can be selected expediently in accordance with their position and function in the read circuit 202a or respectively 202b, for example taking into consideration a polarity of the voltage present at them during operation. If, as in the exemplary embodiment in FIG. 2B (in this respect, also see FIG. 5), a positive supply voltage VDD is applied to the drain output 216G of the first transistor 216, the first transistor 216 can be for example an n-channel field effect transistor or an NPN-type transistor.

For the self-adjustment, during $T_A$ in the course of measuring the voltage $U_A$ (or the corresponding resistance $R_0$) present at the first memory cell element 204 or the voltage derived therefrom, a gate (generally a control terminal) 216S and a drain (generally a controlled terminal) 216G can be short-circuited, such that an operating point of the first transistor 216 is optimized to the effect that an optimum drain level is ensured. This is because in the case of this design, in the course of providing or storing the voltage $U_A/U_0/U_{0A}$ present at the first memory cell element 204 or the voltage derived therefrom, the first transistor 216 is configured to operate in the saturation region, as a result of which it acts as an amplifier and as a voltage limiter for the memory cell element 204. To put it another way, in the first phase $T_A$ the control terminal 216S of the first transistor 216 can be electrically conductively connected to one controlled terminal 216G of the first transistor 216, and in the second phase $T_B$ the control terminal 216S of the first transistor 216 can be isolated from the controlled terminal 216G of the first transistor 216.

If the resistance $R_1$ of the second memory cell element 212 is close to the resistance $R_0$ of the first memory cell element 204, which, as described in the introduction, is the case in particular for new resistive memory devices which have a very small relative read window, during $T_B$ as well the first transistor 216 can still be at the optimum operating point, or only at an insignificant deviation therefrom.

In a comparable manner, the second transistor 217, which is part of the second part 224 or of the second section 226, can be self-adjusted. By way of example, in the first phase $T_A$ a control terminal 217S of the second transistor 217 can be electrically conductively connected to one controlled terminal 217G of the second transistor 217, and in the second phase $T_B$ the control terminal 217S of the second transistor 217 can be isolated from the controlled terminal 217G of the second transistor 217.

4) Minimizing the Number of Devices Used

The following explanations concerning aspects 4 to 8 relate to exemplary evaluation circuits 202c in conjunction with the read circuit 202b. However, they are also applicable, mutatis mutandis, to a combination of the evaluation circuit 202c with the read circuit 202a.

Each transistor in the sense amplifier circuit 202, i.e. not only in the read circuit 202b but also in the evaluation circuit 202c, to which the measurement signals U0A, U1A, U0B and U1B are provided by the read circuit 202a and respectively 202b, can contribute an offset which can corrupt a determined result (the result provided by the evaluation circuit 202c is designated as $U_{out}$) and can thus reduce an accuracy of the result $U_{out}$.

Accordingly, in accordance with various exemplary embodiments, a number of transistors used in the evaluation circuit 202c can be minimized.

Figure 6:
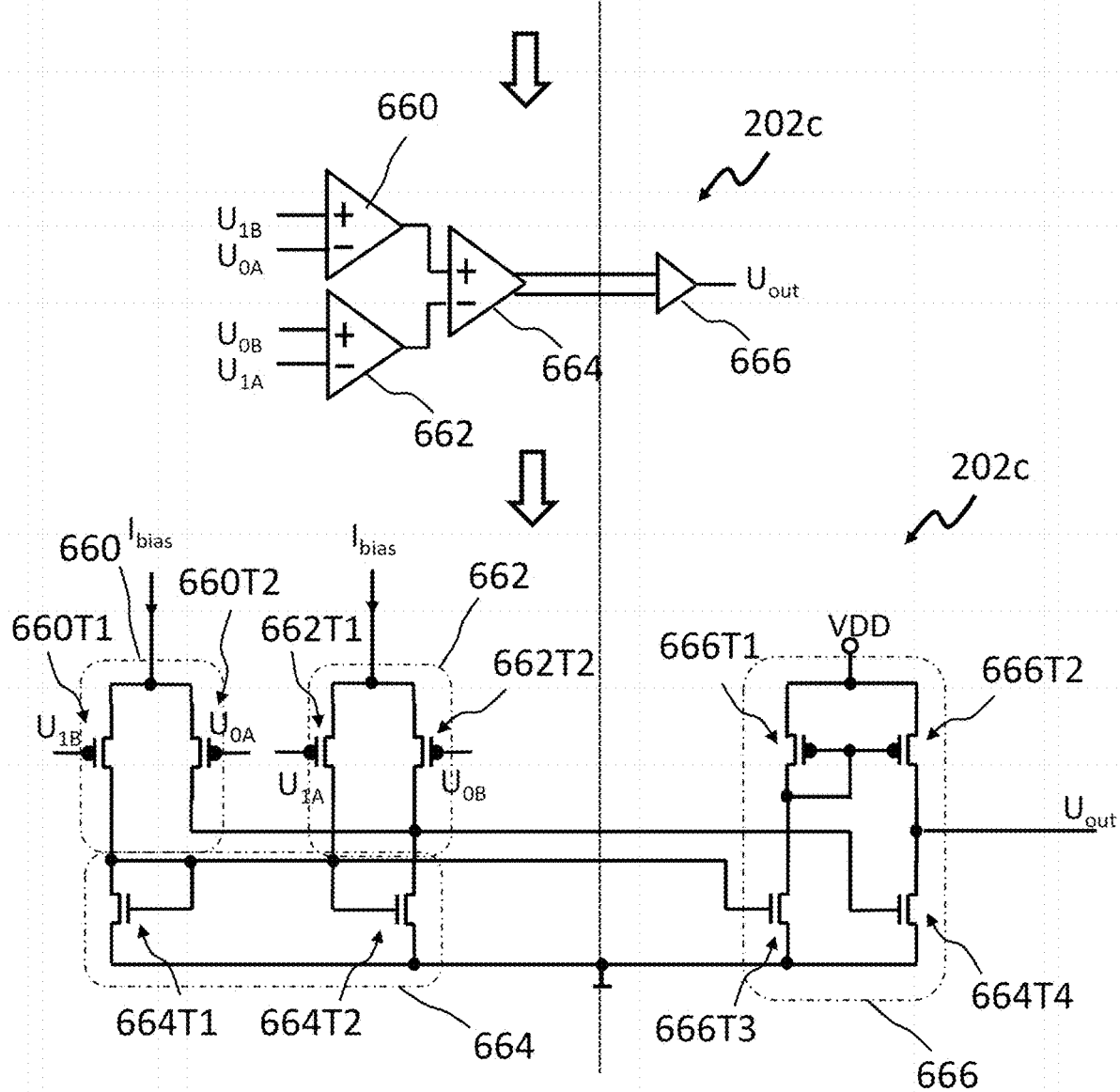
FIG. 6 shows an evaluation circuit for evaluating a state value of a memory cell in accordance with various exemplary embodiments.

FIG. 6 shows (as a block diagram at the top and as a circuit diagram at the bottom) an evaluation circuit 202c for evaluating a state value of a memory cell 204 in accordance with various exemplary embodiments. As can be discerned with reference to the block diagram, four comparators 660, 662, 664 and 666 are used in the evaluation circuit 202c, said comparators comprising only ten transistors in order to generate the output signal $U_{out}$ on the basis of the measurement values $U_{1B}$, $U_{0A}$, $U_{0B}$ and $U_{1A}$ provided by the read circuit 202b. The functions of the comparators 660, 662, 664 and 666 in the evaluation circuit 202c are described hereinafter. An exemplary interconnection of the individual circuit elements, in particular of the transistors, can be gathered from the circuit diagrams in FIG. 6 to FIG. 11.

In the evaluation circuit 202c, a first, second and third comparator 660, 662, 664 serve for comparing the provided measurement values $U_{1B}$, $U_{0A}$, $U_{0B}$ and $U_{1A}$ in such a way (as described in the formula above and in FIG. 6) that the third comparator 664 already provides a state value of the resistive memory cell 204 as an interim result. The latter is amplified to form the usable output signal $U_{out}$ by means of a fourth comparator 666 used as an amplifier 666, wherein the comparator 666 can be configured such that a gain factor a results, such that $2[U_1-U_0]*a=U_{out}$.

For the comparison, in accordance with the exemplary embodiment from FIG. 6 (and the subsequent figures; in order to improve clarity, not all elements of the evaluation circuit 202c and/or of the sense amplifier 202 are designated in all figures; an assignment of the designations across the figures should be straightforward, however), the first comparator 660 can be configured, in the second phase $T_B$, to compare the electrical voltage $U_{1B}$ present at the second resistive memory cell element 212 or the electrical voltage derived therefrom with the voltage $U_{OA}$ fed to the first storage element 218 in the first phase $T_A$. For this purpose, in the second phase $T_B$, the voltage $U_{1B}$ can be provided to a control terminal 660T1S of a third transistor 660T1 (this designation and others serve for differentiation from the first transistor 216 of the read circuit 202a, 202b) of the first comparator 660, and the voltage UOA can be provided to a control terminal 660T2S of a fourth transistor 660T2 of the first comparator 660, wherein the third transistor 660T1 and the fourth transistor 660T2 can be connected in parallel with one another.

Furthermore, in accordance with the exemplary embodiment from FIG. 6, the second comparator 660 can be configured, in the second phase $T_B$, to compare the electrical voltage $U_{OB}$ present at the first resistive memory cell element 204 or the electrical voltage derived therefrom with the voltage $U_{OB}$ fed to the second storage element 220 in the first phase $T_A$. For this purpose, in the second phase $T_B$, the voltage $U_{1A}$ can be provided to a control terminal 662T1S of a fifth transistor 662T1 of the second comparator 662, and the voltage $U_{OB}$ can be provided to a control terminal 662T2S of a sixth transistor 662T2 of the second comparator 662, wherein the fifth transistor 662T1 and the sixth transistor 662T2 can be connected in parallel with one another.

The third comparator 664 can be configured, in the second phase $T_B$, to compare a comparison result of the first comparator 660 with a comparison result of the second comparator 662. For this purpose, a controlled terminal 664T1G and a control terminal 664T1S of a seventh transistor 664 and a control terminal e664T2S of an eighth transistor 664T2 can be connected to the controlled terminal 660T1G of the third transistor 660T1 and the controlled terminal 662T1G of the fifth transistor 662T1, and a controlled terminal 664T2G of the eighth transistor 664T2 can be connected to the control terminal 660T2G of the fourth transistor 660T2 and the controlled terminal 662T2G of the sixth transistor 662T2.

The transistors in the evaluation circuit 202c can be selected expediently in accordance with their position and function in the evaluation circuit 202c, for example taking into consideration a polarity of the voltage present at them during operation. In the exemplary embodiments in FIG. 6 to FIG. 11, the transistors 660T1 and 660T2 of the first comparator 660 and transistors 662T1, 662T2 of the second comparator 662 can be p-channel field effect transistors, for example, and the transistors 664T1 and 664T2 of the third comparator 664 can be n-channel field-effect transistors, or vice-versa.

However, as described above, despite a minimized number of transistors, each of the transistors of the evaluation circuit can have slightly different properties and thus contribute to an offset voltage (also designated as offset) which can adversely affect an accuracy of the result.

5) Offset Compensation

Accordingly, in various exemplary embodiments, the evaluation circuit 202c can be configured to perform an offset compensation.

Figure 7A:
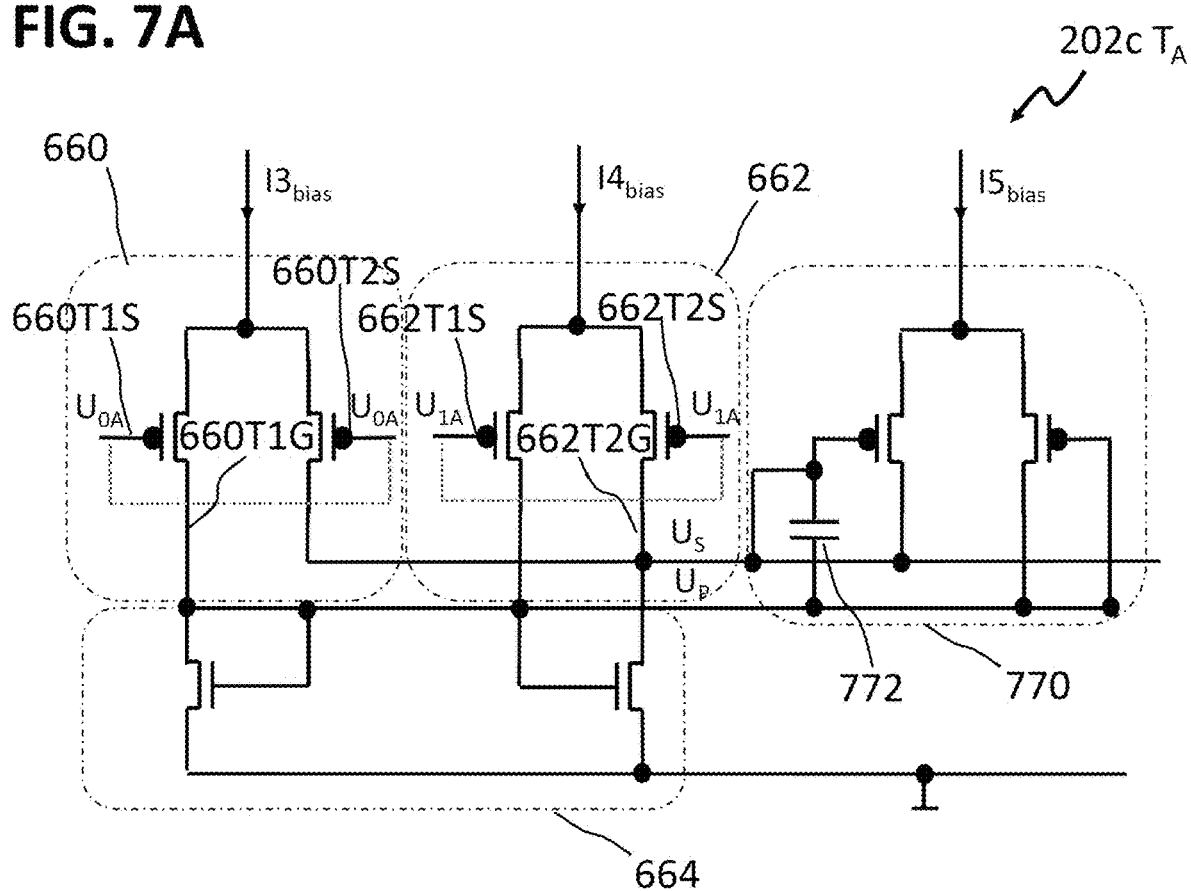
FIG. 7A and FIG. 7B show an evaluation circuit for evaluating a state value of a memory cell in accordance with various exemplary embodiments in a first phase (FIG. 7A) and a second phase (FIG. 7B)
Figure 7B:
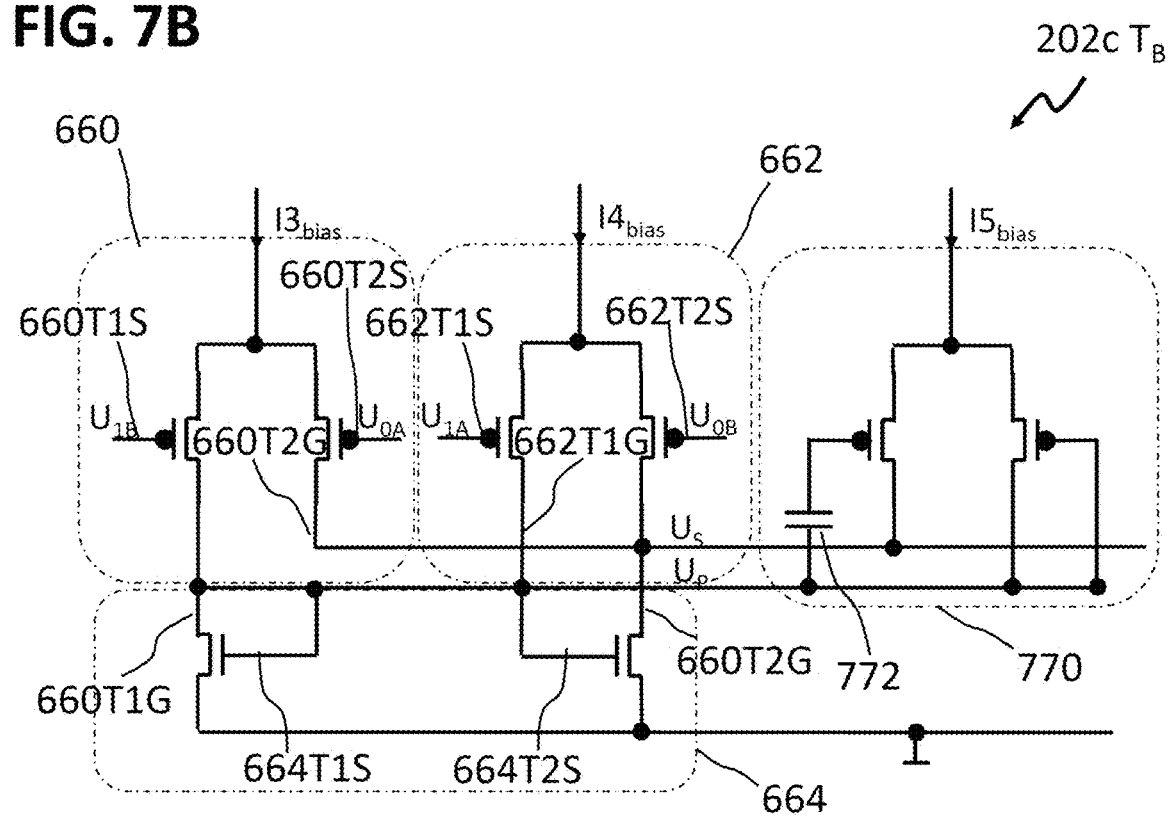

FIG. 7A and FIG. 7B show an evaluation circuit 202c for evaluating a state value of a memory cell 204 in accordance with various exemplary embodiments, wherein the evaluation circuit 202c is configured to perform an offset compensation. This is illustrated by the fact that the evaluation circuit in FIG. 7A is shown in the first phase $T_A$ (identified as 202c $T_A$) and in the second phase $T_B$ (identified as 202c $T_B$).

In various exemplary embodiments, the comparators 660, 662, 664 and 666, which are configured for difference formation as described above for determining the state value of the memory cell, can be offset-compensated via an offset compensation circuit 770.

For this purpose, as illustrated in FIG. 7A, during $T_A$ it is possible to identify and store compensation values that can be employed during $T_B$. For the purpose of storing, the evaluation circuit 202c can comprise a third storage element 772, for example a capacitor.

As is evident for example with reference to FIG. 3A, during $T_A$ those outputs which provide the input values $U_{1B}$, $U_{OA}$ to be compared for the first comparator 660 can be short-circuited: if the switches 214 are in the position $T_A$, $U_{1B}$ is equal to $U_{OA}$. Correspondingly, during $T_A$ those outputs which provide the input values $U_{OB}$, $U_{1A}$ to be compared for the second comparator 662 can be short-circuited: if the switches 214 are in the position $T_A$, $U_{OB}$ is equal to $U_{1A}$. To put it another way, during the first phase $T_A$ the electrical voltage $U_{OA}$ present at the first resistive memory cell element 204 or the electrical voltage derived therefrom can be fed both to the control terminal 660T1S of the third transistor 660T1 and to the control terminal 660T2S of the fourth transistor 660T2, and the electrical voltage $U_{1A}$ present at the second resistive memory cell element 212 or the electrical voltage derived therefrom can be fed both to the control terminal 662T1S of the fifth transistor 662T1 and to the control terminal 662T2S of the sixth transistor 662T2, wherein the third and fourth transistors 660T1, 660T2 are part of the first comparator 660 and wherein the fifth and sixth transistors 662T1, 662T2 are part of the second comparator 662.

Without offsets, voltages $U_S$ and $U_P$ at the correspondingly designated positions should be identical. This is because a line on which $U_P$ is present is connected to the controlled terminal 660T1G of the first comparator 660 and the controlled terminal 662T1G of the second comparator 662, and a further line on which $U_S$ is present is connected to the controlled terminal 660T2G of the first comparator 660 and the controlled terminal 662T2G of the second comparator 662.

If an offset is present, however, it is manifested in a difference between $U_S$ and $U_P$. To put it another way, in the first phase a comparison result of the first comparator 660, apart from an offset voltage, can be equal to a comparison result of the second comparator 662.

The control circuit 332 can be configured to control a switch (not illustrated) in such a way that during $T_A$ the offset, e.g. the voltage difference between $U_S$ and $U_P$, is stored, and during $T_B$ an additional current dependent on the offset is contributed to the interim result to be amplified, which current is suitable for matching $U_S$ and $U_P$ to one another, such that the offset voltage is partly compensated for using the stored offset voltage provided by the third storage element 772 in the second phase $T_B$, in which the state value of the resistive memory cell 204 is determined.

To put it another way, the offset voltage during the first phase $T_A$ can form a voltage difference between a combination of the controlled terminal 660T1G of the third transistor 660T1 and the controlled terminal 662T1G of the fifth transistor 662T1, on the one hand, and a combination of a controlled terminal 660T2G of the fourth transistor 660T2 and a controlled terminal 662T2G of the sixth transistor 662T2, on the other hand. For this purpose, the evaluation circuit 202c can comprise a correspondingly configured first offset compensator circuit 770.

Figure 8:
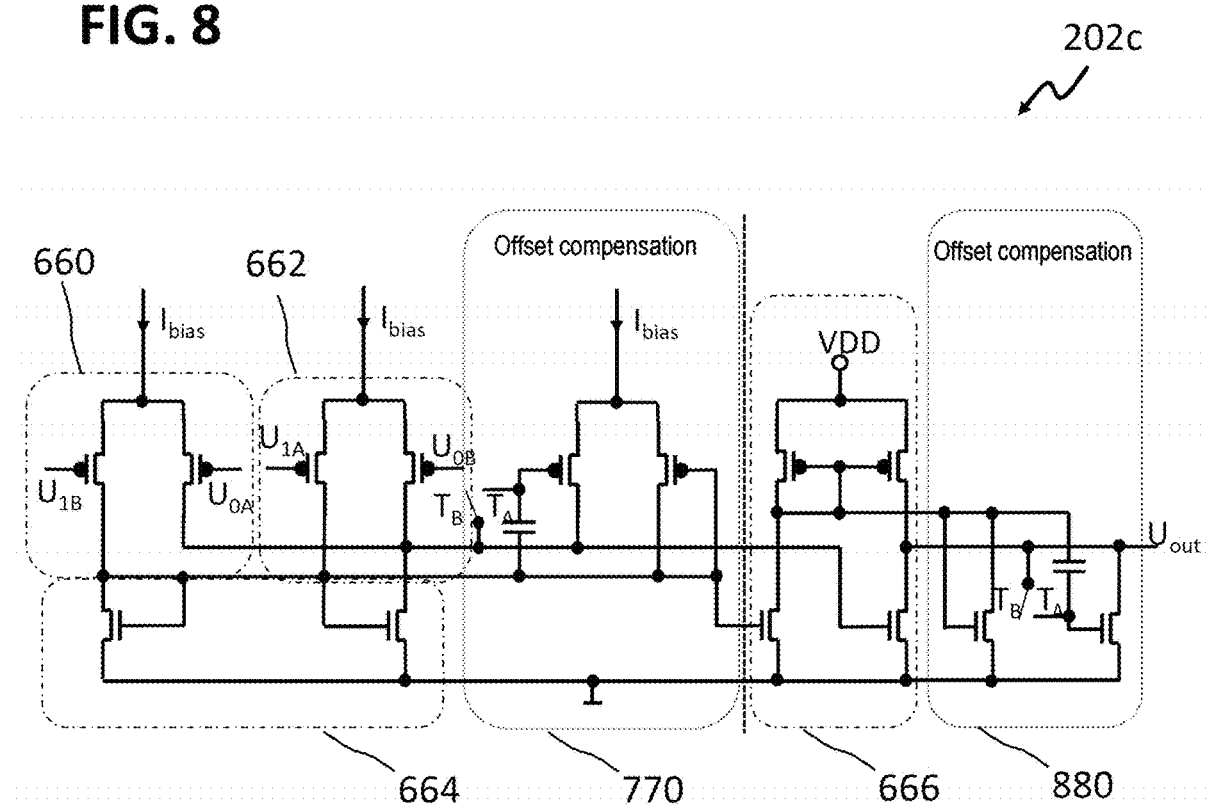
FIG. 8 shows an evaluation circuit for evaluating a state value of a memory cell in accordance with various exemplary embodiments.

As is illustrated in FIG. 8, which in turn shows an evaluation circuit 202c for evaluating a state value of a memory cell in accordance with various exemplary embodiments, an offset compensation can be provided for all amplifiers, that is to say, in addition to the compensation for the offsets that occur in the first, second and third comparators 660, 662, 664 by means of the offset compensator circuit 770, also for the fourth comparator 666, for example by means of a further offset compensator circuit 880.

6) Crosstalk Minimization

If the provided signal fluctuates greatly at input nodes, for example at an input to the fourth comparator (amplifier) 666, this can adversely affect an output value.

In various exemplary embodiments, an influence on the sensitive input nodes can be reduced by means of a fluctuation limiting arrangement.

Figure 9:
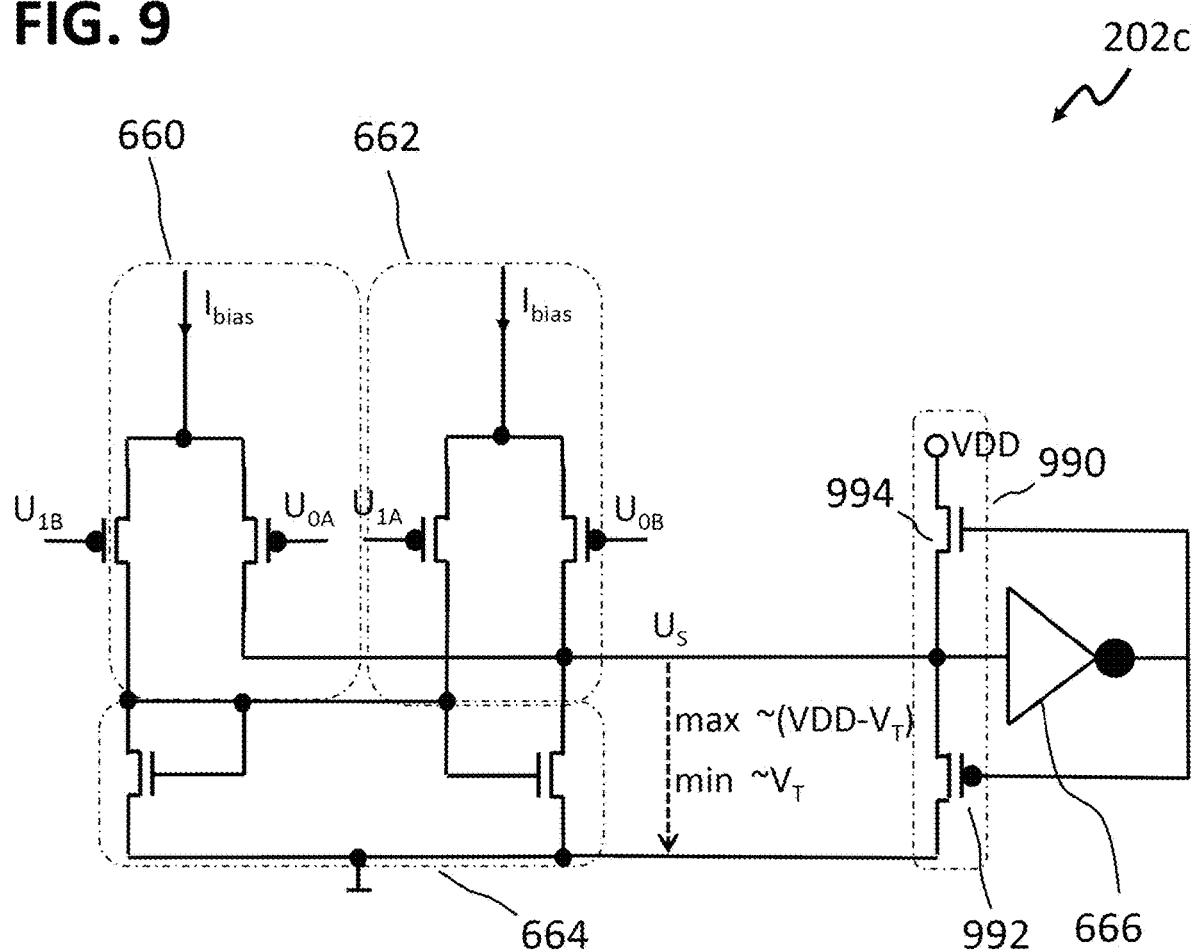
FIG. 9 shows an evaluation circuit for evaluating a state value of a memory cell in accordance with various exemplary embodiments.

FIG. 9 and FIG. 10 each show an evaluation circuit 202c for evaluating a state value of a memory cell 204 in accordance with various exemplary embodiments, each comprising a fluctuation limiting circuit 990.

The exemplary fluctuation limiting circuit 990 can comprise a ninth transistor 994 and a tenth transistor 992. The transistors 992, 994 can be chosen in accordance with their position in the fluctuation limiting circuit 990. By way of example, the ninth transistor 994 can be an n-channel transistor, and the tenth transistor 992 can be a p-channel transistor.

The fluctuation limiting circuit 990 can be configured to restrict the interim result (the comparison result fed to the fourth comparator 666 by the third comparator 664) to a predefined voltage range around a switching voltage of the fourth comparator 666, wherein a grounding voltage and a supply voltage (e.g. VDD) are not part of the predefined voltage range.

By way of example, the fluctuation limiting circuit 990 can be configured such that if $U_S$ falls below the switching voltage of the fourth comparator 666, the ninth transistor (e.g. the n-channel transistor) is activated, and $U_S$ is prevented from falling further.

The same can apply to the tenth transistor in the opposite direction. That is to say that the fluctuation limiting circuit 990 can furthermore be configured such that if $U_S$ rises above the switching voltage of the fourth comparator 666, the tenth transistor (e.g. the p-channel transistor) is activated, and $U_S$ is prevented from rising further.

FIG. 10 shows the evaluation circuit from FIG. 8 supplemented by the fluctuation limiting circuit 990.

7) Reducing Voltage Supply Influences

External voltage feeds may be subject to fluctuations. Therefore, as is illustrated in FIG. 11, which shows a sense amplifier circuit 202 for determining a state value of a memory cell in accordance with various exemplary embodiments, said sense amplifier circuit comprising both the read circuit 202b and the evaluation circuit 202c, the sense amplifier circuit 202 can be configured such that all internal levels refer to the grounding voltage GND, and only bias current/voltages are provided by an (external) voltage supply.

8) Suppressing Disturbance Influences

As is likewise evident with reference to FIG. 11, the sense amplifier circuit 202 is moreover independent of external references that would otherwise contribute to the noise as a result of inaccuracies and interferences/interactions.

Matching the bias currents I1 bias, I2 bias etc. is not necessary in various exemplary embodiments.

FIG. 12 shows, in a block diagram, a sense amplifier circuit for determining a state value of a memory cell in accordance with various exemplary embodiments, wherein the eight aspects explained above are jointly realized.

Figure 13:
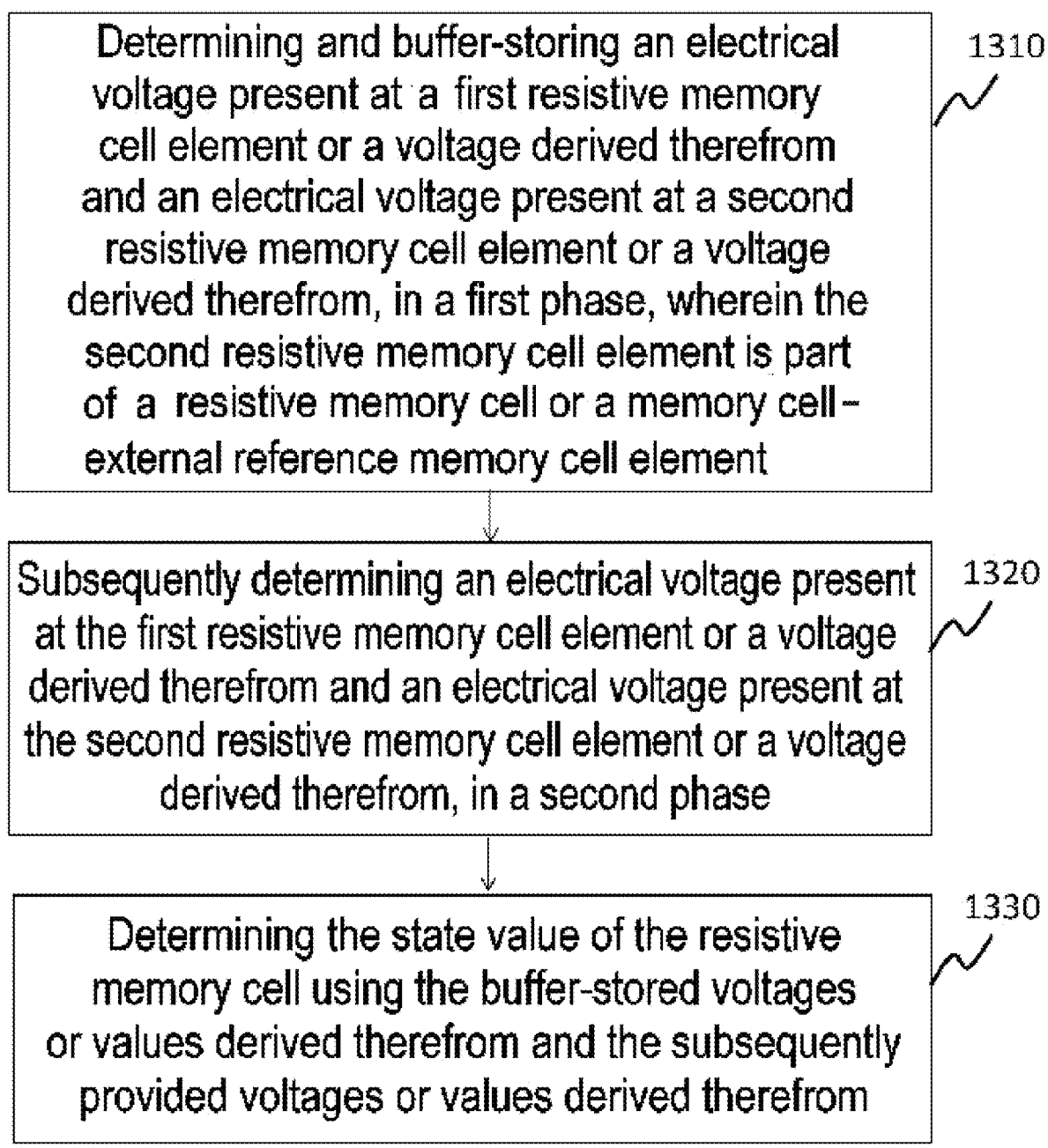
FIG. 13 shows a flow diagram of a method for determining a state value of a memory cell in accordance with various exemplary embodiments.

FIG. 13 shows a flow diagram 1300 of a method for determining a state value of a memory cell in accordance with various exemplary embodiments.

The method can comprise: determining and buffer-storing an electrical voltage present at the first resistive memory cell element or a voltage derived therefrom and an electrical voltage present at a second resistive memory cell element or a voltage derived therefrom, in a first phase, wherein the second resistive memory cell element is part of the resistive memory cell or a memory cell-external reference memory cell element (in 1310). The method further comprises subsequently determining an electrical voltage present at the first resistive memory cell element or a voltage derived therefrom and an electrical voltage present at the second resistive memory cell element or a voltage derived therefrom, in a second phase (in 1320). Lastly, the method comprises and determining the state value of the resistive memory cell using the buffer-stored voltages or values derived therefrom and the subsequently provided voltages or values derived therefrom (in 1330).

A plurality of exemplary embodiments are described below.

Exemplary embodiment 1 provides a sense amplifier circuit for determining a state value of a resistive memory cell, wherein the resistive memory cell comprises a first resistive memory cell element, by means of a second resistive memory cell element, which is part of the resistive memory cell or a memory cell-external reference memory cell element. The sense amplifier circuit can comprise: a switch structure, a first storage element, a second storage element, a control circuit configured to control the switch structure in such a way that in a first phase an electrical voltage present at the first resistive memory cell element or a voltage derived therefrom is fed to the first storage element and an electrical voltage present at the second resistive memory cell element or a voltage derived therefrom is fed to the second storage element, and that in a second phase an electrical voltage present at the first resistive memory cell element or a voltage derived therefrom is provided and an electrical voltage present at the second resistive memory cell element or a voltage derived therefrom is provided, and an evaluation circuit configured to determine a state value of the resistive memory cell using the voltages fed to the storage elements in the first phase, or values derived therefrom, and the voltages provided in the second phase, or values derived therefrom.

Exemplary embodiment 2 is a sense amplifier circuit in accordance with exemplary embodiment 1, wherein the first memory cell element and the second memory cell element have mutually complementary state values.

Exemplary embodiment 3 is a sense amplifier circuit in accordance with either of exemplary embodiments 1 and 2, wherein in the first phase a first part of the sense amplifier circuit is configured for feeding the electrical voltage present at the first resistive memory cell element or the voltage derived therefrom to the first storage element and a second part of the sense amplifier circuit, which is different than the first part, is configured for feeding the electrical voltage present at the second resistive memory cell element or the voltage derived therefrom to the second storage element, and wherein in the second phase a section of the second part is configured for providing the electrical voltage present at the first resistive memory cell element or the voltage derived therefrom and a section of the first part is configured for providing the electrical voltage present at the second resistive memory cell element or the voltage derived therefrom.

Exemplary embodiment 4 is a sense amplifier circuit in accordance with any of exemplary embodiments 1 to 3, wherein the first part of the sense amplifier circuit comprises a first transistor, wherein in the first phase a control terminal of the first transistor is electrically conductively connected to a controlled terminal of the first transistor and in the second phase the control terminal of the first transistor is isolated from the controlled terminal of the first transistor.

Exemplary embodiment 5 is a sense amplifier circuit in accordance with any of exemplary embodiments 1 to 4, wherein the second part of the sense amplifier circuit comprises a second transistor, wherein in the first phase a control terminal of the second transistor is electrically conductively connected to one controlled terminal of the second transistor, and in the second phase the control terminal of the second transistor is isolated from the controlled terminal of the second transistor.

Exemplary embodiment 6 is a sense amplifier circuit in accordance with exemplary embodiment 4 or 5, wherein in the first phase the first transistor and/or the second transistor are/is configured so as to be operated in the saturation region.

Exemplary embodiment 7 is a sense amplifier circuit in accordance with any of exemplary embodiments 1 to 6, wherein the evaluation circuit comprises: a first comparator configured, in the second phase, to compare the electrical voltage present at the second resistive memory cell element or the voltage derived therefrom with the voltage fed to the first storage element in the first phase, and a second comparator configured, in the second phase, to compare the electrical voltage present at the first resistive memory cell element or the voltage derived therefrom with the voltage fed to the second storage element in the first phase.

Exemplary embodiment 8 is a sense amplifier circuit in accordance with exemplary embodiment 7, wherein the first comparator and the second comparator are connected in parallel with one another.

Exemplary embodiment 9 is a sense amplifier circuit in accordance with either of exemplary embodiments 7 and 8, wherein the evaluation circuit furthermore comprises a third comparator configured, in the second phase, to compare a comparison result of the first comparator with a comparison result of the second comparator.

Exemplary embodiment 10 is a sense amplifier circuit in accordance with any of exemplary embodiments 1 to 9, wherein transistors of the first comparator and the transistors of the second comparator are p-channel field-effect transistors and transistors of the third comparator are n-channel field-effect transistors, or vice-versa.

Exemplary embodiment 11 is a sense amplifier circuit in accordance with any of exemplary embodiments 1 to 10, wherein the first and/or the second storage element comprise(s) or consist(s) of a capacitor.

Exemplary embodiment 12 is a sense amplifier circuit in accordance with any of exemplary embodiments 6 to 11, wherein the evaluation circuit is configured in such a way that in the first phase a comparison result of the first comparator, apart from an offset voltage, is equal to a comparison result of the second comparator.

Exemplary embodiment 13 is a sense amplifier circuit in accordance with exemplary embodiment 12, wherein the evaluation circuit furthermore comprises a compensation circuit comprising a third storage element, said compensation circuit being configured to store the offset voltage in the third storage element in the first phase.

Exemplary embodiment 14 is a sense amplifier circuit in accordance with exemplary embodiment 13, wherein the evaluation circuit is furthermore configured to partly compensate for the offset voltage in the second phase using the stored offset voltage provided by the third storage element.

Exemplary embodiment 15 is a sense amplifier circuit in accordance with either of exemplary embodiments 13 and 14, wherein the third storage element comprises or consists of a capacitor.

Exemplary embodiment 16 is a sense amplifier circuit in accordance with any of exemplary embodiments 6 to 15, wherein during the first phase the electrical voltage present at the first resistive memory cell element or the voltage derived therefrom is fed both to a control terminal of a third transistor and to a control terminal of a fourth transistor, and the electrical voltage present at the second resistive memory cell element or the voltage derived therefrom is fed both to a control terminal of a fifth transistor and to a control terminal of a sixth transistor, wherein the third and fourth transistors are part of the first comparator, and wherein the fifth and sixth transistors are part of the second comparator.

Exemplary embodiment 17 is a sense amplifier circuit in accordance with exemplary embodiment 16, wherein during the second phase the electrical voltage present at the second resistive memory cell element or the voltage derived therefrom is fed to the control terminal of the third transistor, the voltage fed to the first storage element by the first memory cell element is fed to the control terminal of the fourth transistor, the voltage fed to the second storage element by the second memory cell element is fed to the control terminal of the fifth transistor, and the electrical voltage present at the first resistive memory cell element or the voltage derived therefrom is fed to the control terminal of the sixth transistor.

Exemplary embodiment 18 is a sense amplifier circuit in accordance with any of exemplary embodiments 15 to 17, wherein the offset voltage during the first phase constitutes a voltage difference caused by the inequality of the component parts at the end of a comparator chain formed by the first comparator, by the second comparator and by the third comparator.

Exemplary embodiment 19 is a sense amplifier circuit in accordance with any of exemplary embodiments 8 to 18, wherein the third comparator is connected in series with the parallel-connected comparators.

Exemplary embodiment 20 is a sense amplifier circuit in accordance with exemplary embodiment 19, wherein the evaluation circuit furthermore comprises a fourth comparator, which is connected in series with the third comparator and with the parallel-connected comparators.

Exemplary embodiment 21 is a sense amplifier circuit in accordance with exemplary embodiment 20, wherein the evaluation circuit furthermore comprises a voltage limiter configured to restrict a comparison result fed to the fourth comparator by the third comparator to a predefined voltage range around a switching voltage of the fourth comparator, wherein a grounding voltage and a supply voltage are not part of the predefined voltage range.

Exemplary embodiment 22 provides a memory device. The memory device can comprise a sense amplifier circuit in accordance with any of exemplary embodiments 1 to 21.

Exemplary embodiment 23 is a memory device in accordance with exemplary embodiment 22, wherein the sense amplifier circuit is configured for determining the state value of the resistive memory cell and for determining a state value of at least one further memory cell comprising a further first memory cell element, wherein the control circuit is configured to control the switch structure in such a way that the first phase and the second phase are realized for exactly one memory cell, wherein the exactly one memory cell is selected from a plurality of memory cells comprising the memory cell and the at least one further memory cell.

Exemplary embodiment 24 is a memory device in accordance with exemplary embodiment 22 or 23, wherein the memory cell is a Dynamic Random Access Memory (DRAM) memory cell or a Magnetic Random Access Memory (MRAM) memory cell.

Exemplary embodiment 25 provides a method for determining a state value of a resistive memory cell comprising a first resistive memory cell element. In this case, the method can comprise: determining and buffer-storing an electrical voltage present at the first resistive memory cell element or a voltage derived therefrom and an electrical voltage present at a second resistive memory cell element or a voltage derived therefrom, in a first phase, wherein the second resistive memory cell element is part of the resistive memory cell or a memory cell-external reference memory cell element, subsequently determining an electrical voltage present at the first resistive memory cell element or a voltage derived therefrom and an electrical voltage present at the second resistive memory cell element or a voltage derived therefrom, in a second phase, determining the state value of the resistive memory cell using the buffer-stored voltages or values derived therefrom and the subsequently provided voltages or values derived therefrom.

Exemplary embodiment 26 is a method in accordance with exemplary embodiment 25, wherein the first memory cell element and the second memory cell element are configured such that they have in each case mutually complementary state values.

Exemplary embodiment 27 is a method in accordance with either of exemplary embodiments 25 and 26, wherein the resistive memory cell is connected to a sense amplifier circuit, wherein the method furthermore comprises: switching the sense amplifier circuit between the first phase and the second phase from a first state into a second state, wherein in the first phase a first part of the sense amplifier circuit is configured for feeding the electrical voltage present at the first resistive memory cell element or the voltage derived therefrom to the first storage element and a second part of the sense amplifier circuit, which is different than the first part, is configured for feeding the electrical voltage present at the second resistive memory cell element or the voltage derived therefrom to the second storage element, and wherein in the second phase a section of the second part is configured for providing the electrical voltage present at the first resistive memory cell element or the voltage derived therefrom and a section of the first part is configured for providing the electrical voltage present at the second resistive memory cell element or the voltage derived therefrom.

Exemplary embodiment 28 is a method in accordance with any of exemplary embodiments 25 to 27, wherein the first part of the sense amplifier circuit comprises a first transistor, the method furthermore comprising: electrically conductively connecting a control terminal of the first transistor to a controlled terminal of the first transistor in the first phase, and isolating the control terminal of the first transistor from the controlled terminal of the first transistor in the second phase.

Exemplary embodiment 29 is a method in accordance with exemplary embodiment 28, furthermore comprising: operating the first transistor in the saturation region in the first phase.

Exemplary embodiment 30 is a method in accordance with any of exemplary embodiments 25 to 29, furthermore comprising in the second phase: first comparison of the electrical voltage present at the second resistive memory cell element or the voltage derived therefrom with the voltage fed to the first storage element in the first phase, and second comparison of the electrical voltage present at the first resistive memory cell element or the voltage derived therefrom with the voltage fed to the second storage element in the first phase.

Exemplary embodiment 31 is a method in accordance with exemplary embodiment 30, wherein the first comparison and the second comparison are carried out simultaneously.

Exemplary embodiment 32 is a method in accordance with exemplary embodiment 30 or 31, furthermore comprising in the second phase: third comparison of a comparison result of the first comparison with a comparison result of the second comparison.

Exemplary embodiment 33 is a method in accordance with any of exemplary embodiments 30 to 32, wherein the sense amplifier circuit comprises a first comparator and a second comparator, the first comparison is carried out by means of the first comparator and the second comparison is carried out by means of the second comparator, wherein the method furthermore comprises in the first phase: determining and storing an offset voltage of the first comparator and of the second comparator.

Exemplary embodiment 34 is a method in accordance with exemplary embodiment 33, wherein the evaluation circuit furthermore comprises a compensation circuit, wherein the evaluation circuit furthermore comprises a wherein the method furthermore comprises: partly compensating for the stored offset voltage in the second phase.

Exemplary embodiment 35 is a method in accordance with either of exemplary embodiments 33 and 34, wherein the first comparator comprises a third transistor and a fourth transistor, and the second comparator comprises a fifth transistor and a sixth transistor, wherein the method furthermore comprises during the first phase: feeding the electrical voltage present at the first resistive memory cell element or the voltage derived therefrom both to a control terminal of the third transistor and to a control terminal of the fourth transistor, and feeding the electrical voltage present at the second resistive memory cell element or the voltage derived therefrom both to a control terminal of the fifth transistor and to a control terminal of the sixth transistor.

Exemplary embodiment 36 is a method in accordance with exemplary embodiment 35, furthermore comprising during the second phase: feeding the electrical voltage present at the second resistive memory cell element or the voltage derived therefrom to the control terminal of the third transistor; feeding the voltage fed to the first storage element by the first memory cell element to the control terminal of the fourth transistor; feeding the voltage fed to the second storage element by the second memory cell element to the control terminal of the fifth transistor; and feeding the electrical voltage present at the first resistive memory cell element or the voltage derived therefrom to the control terminal of the sixth transistor.

Exemplary embodiment 37 is a method in accordance with either of exemplary embodiments 35 and 38, wherein the offset voltage during the first phase constitutes a voltage difference caused by the inequality of the component parts at the end of a comparator chain formed by the first comparator, by the second comparator and by the third comparator.

Exemplary embodiment 38 is a method in accordance with any of exemplary embodiments 32 to 37, furthermore comprising: amplifying a result of the third comparison.

Exemplary embodiment 39 is a method in accordance with exemplary embodiment 32 and any of exemplary embodiments 33 to 38, wherein the sense amplifier circuit comprises a third comparator, wherein the third comparator is connected in series with the first comparator and the second comparator, which are connected in parallel with one another, and wherein the third comparison is carried out by means of the third comparator.

Exemplary embodiment 40 is a method in accordance with exemplary embodiment 38 or 39, wherein the sense amplifier circuit furthermore comprises a fourth comparator, which is connected in series with the third comparator and with the parallel-connected comparators, and wherein amplifying the result of the third comparison is carried out by means of the fourth comparator.

Exemplary embodiment 41 is a method in accordance with any of exemplary embodiments 38 to 40, furthermore comprising: before amplifying and/or in the course of amplifying the result of the third comparison, restricting the comparison result fed to the fourth comparator by the third comparator to a predefined voltage range around a switching voltage of the fourth comparator, wherein a grounding voltage and a supply voltage are not part of the predefined voltage range.

Exemplary embodiment 42 provides a method for operating a memory device. The method can comprise: a method for determining a state value of a resistive memory cell in accordance with any of exemplary embodiments 25 to 41.

Exemplary embodiment 43 is a method in accordance with exemplary embodiment 42, wherein the sense amplifier circuit is configured for determining the state value of the resistive memory cell and for determining a state value of at least one further memory cell comprising a first memory cell element, the method furthermore comprising: switching in such a way that the first phase and the second phase are realized for exactly one memory cell, wherein the exactly one memory cell is selected from a plurality of memory cells comprising the memory cell and the at least one further memory cell.

Exemplary embodiment 44 is a method in accordance with exemplary embodiment 42 or 43, wherein the memory cell is a Dynamic Random Access Memory (DRAM) memory cell or a Magnetic Random Access Memory (MRAM) memory cell.

Some of the exemplary embodiments are described in association with devices, and some of the exemplary embodiments are described in association with methods. Further advantageous configurations of the method are evident from the description of the device, and vice-versa.

The invention claimed is:

1. A sense amplifier circuit for determining a state value of a resistive memory cell, wherein the resistive memory cell comprises a first resistive memory cell element, by means of a second resistive memory cell element, which is part of the resistive memory cell or a memory cell-external reference memory cell element, the sense amplifier circuit comprising:
   a switch structure;
   a first storage element coupled to the switch structure;
   a second storage element coupled to the switch structure;
   a control circuit configured to control the switch structure in such a way that
      in a first phase an electrical voltage present at the first resistive memory cell element or a voltage derived therefrom is fed to the first storage element at a first phase first output, and an electrical voltage present at the second resistive memory cell element or a voltage derived therefrom is fed to the second storage element at a first phase second output;
      in a second phase an electrical voltage present at the first resistive memory cell element or a voltage derived therefrom is provided at a second phase first output and an electrical voltage present at the second resistive memory cell element or a voltage derived therefrom is provided at a second phase second output; and
   an evaluation circuit configured to determine a state value of the resistive memory cell using the voltages fed to the storage elements at the first phase first and second outputs, or values derived therefrom, and the voltages provided at the second phase first and second outputs, or values derived therefrom.

2. The sense amplifier circuit as claimed in claim 1, wherein in the first phase a first part of the sense amplifier circuit is configured to feed the electrical voltage present at the first resistive memory cell element or the voltage derived therefrom to the first storage element and a second part of the sense amplifier circuit, which is different than the first part, is configured to feed the electrical voltage present at the second resistive memory cell element or the voltage derived therefrom to the second storage element, and
wherein in the second phase a section of the second part of the sense amplifier is configured to provide the electrical voltage present at the first resistive memory cell element or the voltage derived therefrom and a section of the first part of the sense amplifier is configured to provide the electrical voltage present at the second resistive memory cell element or the voltage derived therefrom.

3. The sense amplifier circuit as claimed in claim 1, wherein the first part of the sense amplifier circuit comprises a first transistor, wherein in the first phase a control terminal of the first transistor is electrically conductively connected to a controlled terminal of the first transistor and in the second phase the control terminal of the first transistor is isolated from the controlled terminal of the first transistor.

4. The sense amplifier circuit as claimed in claim 1, wherein the evaluation circuit comprises:
   a first comparator configured, in the second phase, to compare the electrical voltage present at the second resistive memory cell element or the voltage derived therefrom with the voltage fed to the first storage element in the first phase, and
   a second comparator configured, in the second phase, to compare the electrical voltage present at the first resistive memory cell element or the voltage derived therefrom with the voltage fed to the second storage element in the first phase.

5. The sense amplifier circuit as claimed in claim 4, wherein the evaluation circuit further comprises a third comparator configured, in the second phase, to compare a comparison result of the first comparator with a comparison result of the second comparator.

6. The sense amplifier circuit as claimed in claim 4,
wherein the evaluation circuit is configured in such a way that in the first phase a comparison result of the first comparator, apart from an offset voltage, is equal to a comparison result of the second comparator.

7. The sense amplifier circuit as claimed in claim 6,
wherein the evaluation circuit further comprises a compensation circuit comprising a third storage element, said compensation circuit being configured to store the offset voltage in the third storage element in the first phase.

8. The sense amplifier circuit as claimed in claim 7,
wherein the evaluation circuit is further configured to partly compensate for the offset voltage in the second phase using the stored offset voltage provided by the third storage element.

9. A memory device comprising:
a sense amplifier circuit for determining a state value of a resistive memory cell, wherein the resistive memory cell comprises a first resistive memory cell element, by means of a second resistive memory cell element, which is part of the resistive memory cell or a memory cell-external reference memory cell element, comprising:
a switch structure;
a first storage element coupled to the switch structure;
a second storage element coupled to the switch structure;
a control circuit configured to control the switch structure in such a way that
in a first phase an electrical voltage present at the first resistive memory cell element or a voltage derived therefrom is fed to the first storage element at a first phase first output, and an electrical voltage present at the second resistive memory cell element or a voltage derived therefrom is fed to the second storage element at a first phase second output;
in a second phase an electrical voltage present at the first resistive memory cell element or a voltage derived therefrom is provided at a second phase first output and an electrical voltage present at the second resistive memory cell element or a voltage derived therefrom is provided at a second phase second output; and
an evaluation circuit configured to determine a state value of the resistive memory cell using the voltages fed to the storage elements at the first phase first and second outputs, or values derived therefrom, and the voltages provided at the second phase first and second outputs, or values derived therefrom.

10. The memory device as claimed in claim 9,
wherein the sense amplifier circuit is configured to determine the state value of the resistive memory cell and determine a state value of at least one further memory cell comprising a further first memory cell element,
wherein the sense amplifier circuit is configured to control the switch structure by means of the control circuit in such a way that the first phase and the second phase are realized for exactly one memory cell, wherein the exactly one memory cell is selected from a plurality of memory cells comprising the memory cell and the at least one further memory cell.

11. A method for determining a state value of a resistive memory cell comprising a first resistive memory cell element, the method comprising:
determining and buffer-storing an electrical voltage present at the first resistive memory cell element or a voltage derived therefrom and an electrical voltage present at a second resistive memory cell element or a voltage derived therefrom, in a first phase, wherein the second resistive memory cell element is part of the resistive memory cell or a memory cell-external reference memory cell element;
subsequently determining an electrical voltage present at the first resistive memory cell element or a voltage derived therefrom and an electrical voltage present at the second resistive memory cell element or a voltage derived therefrom, in a second phase; and
determining the state value of the resistive memory cell using the buffer-stored voltages or values derived therefrom and the subsequently provided voltages or values derived therefrom.

12. The method as claimed in claim 11, wherein the resistive memory cell is connected to a sense amplifier circuit, wherein the method furthermore comprises:
switching the sense amplifier circuit between the first phase and the second phase from a first state into a second state,
wherein in the first phase a first part of the sense amplifier circuit is configured to feed the electrical voltage present at the first resistive memory cell element or the voltage derived therefrom to the first storage element and a second part of the sense amplifier circuit, which is different than the first part, is configured to feed the electrical voltage present at the second resistive memory cell element or the voltage derived therefrom to the second storage element, and
wherein in the second phase a section of the second part is configured to provide the electrical voltage present at the first resistive memory cell element or the voltage derived therefrom and a section of the first part is configured to provide the electrical voltage present at the second resistive memory cell element or the voltage derived therefrom.

13. The method as claimed in claim 11, wherein the first part of the sense amplifier circuit comprises a first transistor, the method further comprising:
electrically conductively connecting a control terminal of the first transistor to a controlled terminal of the first transistor in the first phase, and
isolating the control terminal of the first transistor from the controlled terminal of the first transistor in the second phase.

14. The method as claimed in claim 11, further comprising in the second phase:
performing a first comparison of the electrical voltage present at the second resistive memory cell element or the voltage derived therefrom with the voltage fed to the first storage element in the first phase, and
performing a second comparison of the electrical voltage present at the first resistive memory cell element or the voltage derived therefrom with the voltage fed to the second storage element in the first phase.

15. The method as claimed in claim 14, wherein the first comparison and the second comparison are carried out concurrently.

16. The method as claimed in claim 14, further comprising in the second phase:
performing a third comparison of a comparison result of the first comparison with a comparison result of the second comparison.

17. The method as claimed in claim 16, wherein the sense amplifier circuit comprises a third comparator, wherein the third comparator is connected in series with the first comparator and the second comparator, which are connected in parallel with one another, and wherein the third comparison is carried out by means of the third comparator.

18. The method as claimed in claim 17, wherein the sense amplifier circuit further comprises a fourth comparator, which is connected in series with the third comparator and with the parallel-connected comparators, and wherein amplifying the result of the third comparison is carried out by means of the fourth comparator.

19. The method as claimed in claim 17, further comprising:
  before amplifying and/or in the course of amplifying the result of the third comparison, restricting the comparison result fed to the fourth comparator by the third comparator to a predefined voltage range around a switching voltage of the fourth comparator, wherein a grounding voltage and a supply voltage are not part of the predefined voltage range.

20. The method as claimed in claim 14, wherein the sense amplifier circuit comprises a first comparator and a second comparator, wherein the first comparison is carried out by means of the first comparator and the second comparison is carried out by means of the second comparator, and wherein the method furthermore comprises in the first phase:
  determining and storing offset voltages of the first comparator, of the second comparator and of the third comparator.

21. The method as claimed in claim 20, wherein the evaluation circuit further comprises a compensation circuit, wherein the method further comprises:
  partly compensating for the stored offset voltages in the second phase.

* * * * *